(12) United States Patent
Fukuda et al.

(10) Patent No.: US 8,598,688 B2
(45) Date of Patent: Dec. 3, 2013

(54) SEMICONDUCTOR DEVICE

(75) Inventors: Kyohei Fukuda, Matsumoto (JP); Eiji Mochizuki, Matsumoto (JP); Mitsutoshi Sawano, Matsumoto (JP); Takaaki Suzawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 209 days.

(21) Appl. No.: 13/157,746

(22) Filed: Jun. 10, 2011

(65) Prior Publication Data

US 2012/0313224 A1 Dec. 13, 2012

(30) Foreign Application Priority Data

Jun. 10, 2010 (JP) ................................. 2010-133365

(51) Int. Cl.
*H01L 29/06* (2006.01)
(52) U.S. Cl.
USPC ............ 257/622; 257/E29.022; 257/E21.499; 438/106; 438/478
(58) Field of Classification Search
USPC ............. 257/622, E29.022, E21.09, E21.499; 438/106, 478
See application file for complete search history.

(56) References Cited

U.S. PATENT DOCUMENTS

| | | | | |
|---|---|---|---|---|
| 6,646,325 B2* | 11/2003 | Yamaguchi | ................... | 257/622 |
| 7,859,084 B2* | 12/2010 | Utsumi et al. | ................ | 257/620 |
| 2001/0002340 A1* | 5/2001 | Eldridge et al. | ................ | 439/66 |
| 2006/0249797 A1 | 11/2006 | Nakazawa et al. | | |
| 2009/0290273 A1* | 11/2009 | Shih et al. | ....................... | 361/56 |

FOREIGN PATENT DOCUMENTS

| | | |
|---|---|---|
| JP | 2006-049777 A | 2/2006 |
| JP | 2006-156926 A | 6/2006 |
| JP | 2006-303410 A | 11/2006 |
| JP | 2007-123357 A | 5/2007 |
| JP | 2008-130622 A | 6/2008 |
| WO | 2009/139417 A1 | 11/2009 |

\* cited by examiner

*Primary Examiner* — Phuc Dang
(74) *Attorney, Agent, or Firm* — Rossi, Kimms & McDowell LLP

(57) ABSTRACT

A semiconductor device and manufacturing method are disclosed which prevent breakage and chipping of a semiconductor chip and improve device characteristics. A separation layer is in a side surface of an element end portion of the chip. An eave portion is formed by a depressed portion in the element end portion. A collector layer on the rear surface of the chip extends to a side wall and bottom surface of the depressed portion, and is connected to the separation layer. A collector electrode is over the whole surface of the collector layer, and is on the side wall of the depressed portion. The thickness of an outermost electrode film is 0.05 μm or less. The collector electrode on the rear surface of the chip is joined onto an insulating substrate via a solder layer, which covers the collector electrode on a flat portion of the rear surface of the semiconductor chip.

9 Claims, 20 Drawing Sheets

A Element end portion side    B Active region side

SEMICONDUCTOR DEVICE

BACKGROUND OF THE INVENTION

A. Field of the Invention

The present invention relates to a semiconductor device and semiconductor device manufacturing method.

B. Description of the Related Art

A reverse blocking type of semiconductor element having bidirectional voltage resistance characteristics is commonly known as a power semiconductor element used in a power converting device or the like. With the reverse blocking type of semiconductor element, it is necessary to extend a p-n junction from the rear surface to the front surface of the semiconductor element in order to ensure reverse voltage resistance. In order to form the p-n junction extending from the rear surface to the front surface, a separation layer formed from a diffusion layer is provided in an element end portion of the semiconductor element.

A reverse blocking type of semiconductor element in which a depression portion is provided in the rear surface of an element end portion, including a portion (hereafter called an eave portion) thinner than an active region side is commonly known. In this case, the separation layer is provided in the eave portion, which is the element end portion. In order to form the p-n junction extending from the rear surface to the front surface the p-n junction is also provided on a side wall and bottom surface of the depressed portion.

As this kind of reverse blocking type of semiconductor element, in a semiconductor device including a first conductivity type semiconductor substrate, a second conductivity type first region formed in a peripheral portion of a surface layer of a first main surface of the semiconductor substrate, a second conductivity type well region formed on a surface layer of the first main surface of the semiconductor substrate, detached from the first region and surrounded by the first region, a first conductivity type emitter region formed on a surface layer of the well region, a gate electrode, sandwiched between the emitter region and semiconductor substrate, formed across a gate insulating film on the well region, an interlayer insulating film whose surface is covered, including on the gate electrode, an emitter electrode in contact with the emitter region and well region formed on the interlayer insulating film, a passivation film formed on the emitter electrode, on the first region, and on the semiconductor substrate, a collector layer formed on a surface layer of a second main surface of the semiconductor substrate, a second conductivity type separation layer in contact with the first main surface and second main surface formed on a surface layer of a side wall of the semiconductor substrate in such a way as to make contact with the first region and collector layer, and a collector electrode on the collector layer, there is proposed an element formed from a first side wall wherein the side wall of the semiconductor substrate makes contact vertically with the first main surface, and makes contact with the first region, and a second side wall connected to the first side wall and second main surface, wherein the angle formed with the first side wall is 90 degrees or more (for example, refer to International Publication No. 2009/139417, pamphlet).

As a reverse blocking type of semiconductor element wherein, by a depressed portion passing from the rear surface through to the front surface of the semiconductor element being provided, no eave portion is provided, there is proposed an element including a second conductivity type base region selectively provided in a surface region of a first main surface of a first conductivity type semiconductor substrate, a first conductivity type emitter region selectively provided in a surface region of the base region, an MOS gate structure including a gate insulating film formed on a portion of the surface of the base region sandwiched by the semiconductor substrate and emitter region and a gate electrode provided on the gate insulating film, an emitter electrode in contact with the emitter region and base region, a second conductivity type collector layer provided on a surface layer of a second main surface of the semiconductor substrate, a collector electrode in contact with the collector layer, and a second conductivity type separation layer linked to the collector layer, surrounding the MOS gate structure, and reaching the first main surface from the second main surface at an inclination with respect to the first main surface, wherein the separation layer is covered with the collector electrode (for example, refer to JP-A-2006-303410).

As a semiconductor element whose element end portion is thin in comparison with an active region side, there is proposed an element in which a first semiconductor region on a base layer of a semiconductor substrate is formed from a semiconductor layer of the same conductivity type as the base layer, a second semiconductor region p-n joined to the first semiconductor region is formed from a semiconductor layer of a conductivity type differing from that of the first semiconductor region, a mesa portion forming an inclined surface is formed in an outer peripheral edge portion of the semiconductor substrate, a protective film is formed covering the inclined surface of the mesa portion, the second semiconductor region is formed divided evenly into a main region in contact with a first electrode and a sub-region not in contact with the first electrode, and one portion of the first semiconductor region is interposed between the main region and sub-region of the second semiconductor region (for example, refer to JP-A-2008-130622).

The following method is proposed as a manufacturing method of a reverse blocking type of semiconductor element. A thin semiconductor wafer on which are formed a front surface structure and rear surface structure configuring a semiconductor chip is affixed to a support substrate with two-sided adhesive tape, a trench, which is to be a scribe line, is formed with the crystal face exposed in the thin semiconductor wafer by a wet anisotropic etching, and a separation layer that maintains reverse voltage resistance is formed by an ion implantation and low temperature annealing or laser annealing in a side surface of the trench with the crystal face exposed in such a way as to extend to the front surface side in contact with a p-collector region, which is a rear surface diffusion layer. After carrying out a laser dicing, cleanly cutting the collector electrode by an appropriate amount below the separation layer, the two-sided adhesive tape is removed from the collector electrode, obtaining a semiconductor chip (for example, refer to JP-A-2006-303410 and JP-A-2006-156926).

An alternative method has been proposed. A surface element is formed on a surface of a semiconductor wafer, with the surface on which the surface element is formed facing up. Then, an etching mask is formed using a double-sided aligner. Next, a support substrate is joined to the surface element side, and a trench is formed by etching. Continuing, the etching mask is removed, and a metal film is formed. At this time, for example, an electrode protecting mask is formed above the trench so that the metal film is not formed on a side surface of the semiconductor wafer or in the trench. Then, the support substrate is detached, and chips are obtained by dicing (for example, refer to JP-A-2007-123357).

Also, there is proposed a power device having a package structure in which a semiconductor chip on which is formed the heretofore described reverse blocking type of semiconductor element is joined onto an insulating substrate by the same method as for a flat semiconductor chip. FIG. 36 is a sectional view showing a main portion of a structure of a heretofore known semiconductor device. The semiconductor device shown in FIG. 36 includes semiconductor chip 100, and insulating substrate 112 such as a ceramic insulating substrate (a DBC substrate: a direct bonding copper substrate). In FIG. 36, in order to clarify the junction portion between insulating substrate 112 and semiconductor chip 100, a resin case, an external terminal, a wire bonding, and the like, are omitted from the drawing (the same also applies hereafter in FIGS. 1, 10, 13, 18, and 35).

The heretofore described kind of reverse blocking type of semiconductor element is formed on semiconductor chip 100. Specifically, front surface element structure 102 such as an MOS gate structure or voltage resistant structure is provided on the front surface of n-type drift region 101 formed from semiconductor chip 100. A base region, an emitter region, and the like, provided on a surface layer of drift region 101 are omitted from the drawing (the same also applies hereafter in FIGS. 1 to 20, 37, and 38). P-type separation layer 103 is provided on a side surface of an element end portion of semiconductor chip 100.

By depressed portion 104 reaching separation layer 103 being provided in the element end portion on the rear surface of semiconductor chip 100, eave portion 105 is formed. Also, p-type collector layer 106 is provided on the surface layer of drift region 101, as a rear surface element structure, on the rear surface of semiconductor chip 100. Collector layer 106 extends to a side wall and bottom surface of depressed portion 104, and is connected to separation layer 103. Collector electrode 107 is provided over the whole surface of collector layer 106.

Collector electrode 107 provided over the whole of the rear surface of semiconductor chip 100 is joined via solder layer 111 to a circuit pattern (hereafter called a Cu pattern) formed from copper (Cu) or the like on insulating substrate 112. That is, solder layer 111 is formed more thickly in a region under eave portion 105 than on the active region side. Then, the whole of the rear surface of semiconductor chip 100 is joined to the Cu pattern of insulating substrate 112 (hereafter called simply insulating substrate 112) via solder layer 111. Although omitted from the drawing, the surface of insulating substrate 112 opposite to the surface on which the Cu pattern is provided is joined by soldering to, for example, a Cu base for cooling.

FIGS. 37 and 38 are illustrations sequentially showing a heretofore known semiconductor device manufacturing method. Herein, although the semiconductor wafer is shown in the drawing with the front surface facing up, the surfaces of the semiconductor wafer are inverted as appropriate in each step (the same also applies hereafter in FIGS. 2 to 9, 11, 12, 14 to 17, 19, and 20). Firstly, as shown in FIG. 37, separation layer 103 formed from a p-type diffusion layer, and front surface element structure 102 such as an MOS gate structure or voltage resistant structure, are formed sequentially on the front surface of n-type semiconductor wafer 201.

Next, depressed portion 104 reaching the separation layer 103, and collector layer 106 extending to the side wall and bottom surface of depressed portion 104 and connected to separation layer 103, are formed on the rear surface of semiconductor wafer 201. Depressed portion 104 is formed on, for example, the scribe line of semiconductor wafer 201. Next, collector electrode 107, in contact with collector layer 106 and extending to the side wall and bottom surface of depressed portion 104, is formed.

Next, as shown in FIG. 38, dicing tape 204 is affixed to the rear surface of the semiconductor wafer, and the semiconductor wafer is placed on, for example, a flat stand. Then, the semiconductor wafer is diced along the scribe lines, and the semiconductor wafer is cut into individual semiconductor chips 100. Next, by joining semiconductor chip 100 to insulating substrate 112 via solder layer 111, the semiconductor device shown in FIG. 36 is completed.

In this way, as a semiconductor device having a package structure wherein a semiconductor chip is joined via a solder layer to an insulating substrate, there is proposed a device including a mounting part, having on a lower surface inner side a solder attachment surface having solder wettability that is smaller than the external dimensions of the mounting part, formed in such a way that the solder attachment surface protrudes below an outer side surface of the mounting part, a mounted body, whose perimeter is surrounded by a solder resist that does not have solder wettability, that has a solder resist opening portion having solder wettability on which the solder attachment surface of the mounting part is placed, and a solder that joins the solder attachment surface of the mounting part and the solder resist opening portion of the mounted body, wherein the solder resist opening portion of the mounted body is surrounded by the solder resist in such a way that a narrow portion slightly larger than the dimensions of the solder attachment surface of the mounting part, and a wide portion larger than the external dimensions of the mounting part, are adjacent on each edge (for example, refer to JP-A-2006-049777).

However, in the semiconductor device shown in FIG. 36, each member, such as semiconductor chip 100, insulating substrate 112, the Cu pattern (not shown) on insulating substrate 112, and the Cu base (not shown), has a different thermal expansion rate. Furthermore, eave portion 105, which is thinner than the active region side, is provided in the element end portion of semiconductor chip 100. Then, eave portion 105 is completely joined to insulating substrate 112 via solder layer 111.

When a thermal shock such as thermal stress is applied to this kind of semiconductor device using, for example, a temperature cycle (H/C), each of the members configuring the semiconductor device expands at a different thermal expansion rate. For this reason, stress due to the expansion of the other members is exerted from the exterior on semiconductor chip 100, which is completely joined to the other members, and a bending stress is exerted on eave portion 105, which is thinner than the active region side. Because of this, the following problems occur in the element end portion of semiconductor chip 100.

FIG. 35 is a sectional view showing in detail a main portion of a structure of a heretofore known semiconductor device. As shown in FIG. 35, $p^+$ field limiting ring (FLR) 121, field plate (FP) 122, passivation film 123, and the like, are provided as, for example, a voltage resistant structure in an element end portion of semiconductor chip 100. When bending stress is exerted on eave portion 105 as heretofore described, crack 131 occurs at the base of eave portion 105, that is, at the boundary between eave portion 105 and a portion of semiconductor chip 100 thicker than eave portion 105. Because of this, there is a danger of breakage or chipping occurring in semiconductor chip 100. Also, crack 132 and detachment 133 occur in FP 122 and passivation film 123 provided on eave portion 105. Because of this, there occurs a danger of the device characteristics of the semiconductor device deteriorating.

Also, in an inner portion of FP 122 formed from, for example, an aluminum (Al) alloy, an intermetallic compound formed from a constituent of the Al alloy grows due to a thermal shock such as thermal stress applied to the semiconductor device, and a void occurs due to the growth of the intermetallic compound. Because of this, there is a danger of the device characteristics of the semiconductor device deteriorating. Furthermore, due to the stress exerted on eave portion 105 of the semiconductor chip, the void in the inner portion of FP 122 provided on eave portion 105 changes shape, and there is a danger of cracking or detachment occurring in FP 122 or in the passivation film 123 in contact with FP 122.

The heretofore described problems, not being limited to the semiconductor device shown in FIG. 35, occur in the same way in the semiconductor device shown in JP-A-2006-303410 in which is mounted a semiconductor chip in which no eave portion is provided. For example, with the semiconductor device shown in JP-A-2006-303410, a cracking or detachment occurs in a passivation film provided on the front surface of the semiconductor chip.

The present invention is directed to overcoming or at least reducing the effects of one or more of the problems set forth above.

SUMMARY OF THE INVENTION

The invention, in order to eliminate the problems of the heretofore known technology, provides a semiconductor device and semiconductor device manufacturing method that prevent breakage and chipping of a semiconductor chip. Also, the invention provides a semiconductor device and semiconductor device manufacturing method that prevent deterioration of device characteristics. Also, the invention provides a semiconductor device and semiconductor device manufacturing method whereby the device characteristics improve.

A semiconductor device according to a first aspect of the invention includes a front surface element structure provided on a first main surface of a first conductivity type substrate, a second conductivity type first semiconductor region provided in an element end portion of the first main surface of the substrate, a depressed portion reaching the first semiconductor region from a second main surface of the substrate, a second conductivity type second semiconductor region electrically connected to the first semiconductor region provided on the second main surface of the substrate, and an electrode formed from an electrode film of at least more than one layer provided over the whole surface of the second semiconductor region. The thickness of the outermost electrode film of the electrode provided on a side wall of the depressed portion is 0.05 μm or less.

According to a second aspect of the invention, with the semiconductor device of the first aspect of the invention, the thickness of the outermost electrode film of the electrode provided on a bottom surface of the depressed portion is 0.05 μm or less.

According to a third aspect of the invention, the semiconductor device according to the first aspect of the invention further includes a solder layer covering the electrode other than the electrode provided on the side wall and bottom surface of the depressed portion.

According to a fourth aspect of the invention, with the semiconductor device according to the third aspect of the invention, the solder layer further covers the electrode provided on an open end portion of the depressed portion.

A semiconductor device according to a fifth aspect of the invention includes a front surface element structure provided on a first main surface of a first conductivity type substrate, a second conductivity type first semiconductor region provided in an element end portion of the first main surface of the substrate, a depressed portion reaching the first semiconductor region from a second main surface of the substrate, a second conductivity type second semiconductor region electrically connected to the first semiconductor region provided on the second main surface of the substrate, and an electrode in contact with the second semiconductor region provided extending from an element central portion of the second main surface of the substrate to a side wall of the depressed portion.

A semiconductor device according to a sixth aspect of the invention includes a front surface element structure provided on a first main surface of a first conductivity type substrate, a second conductivity type first semiconductor region provided in an element end portion of the first main surface of the substrate, a depressed portion reaching the first semiconductor region from a second main surface of the substrate, a second conductivity type second semiconductor region electrically connected to the first semiconductor region provided on the second main surface of the substrate, and an electrode provided over the whole surface of the second semiconductor region. The electrode provided on a side wall and bottom surface of the depressed portion is covered with a film formed from a material with poor solder wettability.

According to a seventh aspect of the invention, with the semiconductor device according to the sixth aspect of the invention, the film formed from a material with poor solder wettability covers only the electrode provided on the bottom surface of the depressed portion.

According to an eighth aspect of the invention, with the semiconductor device according to the sixth aspect of the invention, the film formed from a material with poor solder wettability is a polyimide resin film.

According to a ninth aspect of the invention, the semiconductor device according to the fifth aspect of the invention further includes a solder layer covering the electrode exposed on the second main surface side of the substrate.

A semiconductor device manufacturing method according to a tenth aspect of the invention includes a first semiconductor region formation step of forming a second conductivity type first semiconductor region on a first main surface of a first conductivity type wafer, a front surface element structure formation step of forming a front surface element structure on the first main surface of the wafer, a depressed portion formation step of forming a depressed portion reaching the first semiconductor region from a second main surface of the wafer, a second semiconductor region formation step of forming a second conductivity type second semiconductor region electrically connected to the first semiconductor region on the second main surface of the wafer, and an electrode formation step of forming an electrode formed from an electrode film of at least more than one layer over the whole surface of the second semiconductor region. In the electrode formation step, the thickness of the outermost electrode film of the electrode formed on a side wall of the depressed portion is 0.05 μm or less.

According to an eleventh aspect of the invention, with the semiconductor device manufacturing method according to the tenth aspect of the invention, in the electrode formation step, the thickness of the outermost electrode film of the electrode formed on a bottom surface of the depressed portion is 0.05 μm or less.

A semiconductor device manufacturing method according to a twelfth aspect of the invention includes a first semiconductor region formation step of forming a second conductivity type first semiconductor region on a first main surface of a first conductivity type wafer, a front surface element structure formation step of forming a front surface element structure on the first main surface of the wafer, a depressed portion formation step of forming a depressed portion reaching the first semiconductor region from a second main surface of the wafer, a second semiconductor region formation step of forming a second conductivity type second semiconductor region electrically connected to the first semiconductor region on the second main surface of the wafer, a mask formation step of forming a mask covering a bottom surface of the depressed portion, and an electrode formation step of forming an electrode formed on the surface of the second semiconductor region with the mask as a mask.

According to a thirteenth aspect of the invention, the semiconductor device manufacturing method according to the tenth aspect of the invention further includes a cutting step of cutting the wafer into individual chips after the electrode formation step, and a joining step of joining the second main surface of the chip to a circuit substrate via a solder layer.

A semiconductor device manufacturing method according to a fourteenth aspect of the invention includes a first semiconductor region formation step of forming a second conductivity type first semiconductor region on a first main surface of a first conductivity type wafer, a front surface element structure formation step of forming a front surface element structure on the first main surface of the wafer, a depressed portion formation step of forming a depressed portion reaching the first semiconductor region from a second main surface of the wafer, a second semiconductor region formation step of forming a second conductivity type second semiconductor region electrically connected to the first semiconductor region on the second main surface of the wafer, an electrode formation step of forming an electrode over the whole surface of the second semiconductor region, a first film formation step of forming a film formed from a material with poor solder wettability over the whole surface of the electrode, and a removal step of removing the film formed from a material with poor solder wettability, leaving it on only a side wall and bottom surface of the depressed portion.

According to a fifteenth aspect of the invention, with the semiconductor device manufacturing method according to the fourteenth aspect of the invention, in the removal step, the film formed from a material with poor solder wettability is removed, leaving it on only the bottom surface of the depressed portion.

According to a sixteenth aspect of the invention, the semiconductor device manufacturing method according to the fourteenth aspect of the invention further includes a cutting step of cutting the wafer into individual chips after the removal step, and a joining step of joining the second main surface of the chip to a circuit substrate via a solder layer.

A semiconductor device manufacturing method according to a seventeenth aspect of the invention includes a first semiconductor region formation step of forming a second conductivity type first semiconductor region on a first main surface of a first conductivity type wafer, a front surface element structure formation step of forming a front surface element structure on the first main surface of the wafer, a depressed portion formation step of forming a depressed portion reaching the first semiconductor region from a second main surface of the wafer, a second semiconductor region formation step of forming a second conductivity type second semiconductor region electrically connected to the first semiconductor region on the second main surface of the wafer, an electrode formation step of forming an electrode over the whole surface of the second semiconductor region, and a second film formation step of forming a film formed from a material with poor solder wettability on only a side wall and bottom surface of the depressed portion.

According to an eighteenth aspect of the invention, with the semiconductor device manufacturing method according to the seventeenth aspect of the invention, in the second film formation step, the film formed from a material with poor solder wettability is formed on only the bottom surface of the depressed portion.

According to a nineteenth aspect of the invention, the semiconductor device manufacturing method according to the seventeenth aspect of the invention further includes a cutting step of cutting the wafer into individual chips after the electrode formation step and before the second film formation step, and a joining step of joining the second main surface of the chip to a circuit substrate via a solder layer.

According to a twentieth aspect of the invention, with the semiconductor device manufacturing method according to the fourteenth aspect of the invention, the film formed from a material with poor solder wettability is a polyimide resin film.

According to the invention, it is possible to worsen the solder wettability in at least the bottom surface and a bottom surface corner portion of the depressed portion. Because of this, at least the bottom surface and bottom surface corner portion (an eave portion) of the depressed portion are not joined to the circuit substrate by the solder layer. Consequently, even when the circuit substrate, or the like, expands due to a thermal shock, and stress is exerted on the substrate from the exterior, it is possible to prevent bending stress being exerted on the eave portion. Also, as it is possible to prevent bending stress being exerted on the eave portion, it is possible to prevent cracking and detachment occurring in the FP and passivation film provided on the eave portion.

According to the fifth aspect of the invention, the solder layer is provided in such a way as to cover a flat portion (flat portion) of the rear surface of the substrate and the side wall of the depressed portion. For this reason, the junction area of the substrate and, for example, the Cu base for cooling joined thereto across the circuit substrate increases in comparison with a semiconductor device in which the solder layer is provided on only the flat portion of the rear surface of the substrate, and it is possible to improve heat radiation.

According to the tenth to twentieth aspects of the invention, by making the thickness of the outermost electrode film of the electrode on the side wall of the depressed portion 0.05 μm or less, not forming the electrode on the bottom surface of the depressed portion, and forming a film covering the electrode on at least the bottom surface and bottom surface corner portion of the depressed portion, it is possible to worsen the solder wettability in the bottom surface and bottom surface corner portion of the depressed portion. Because of this, it does not happen in the joining step that the melted solder creeps up from the flat portion side of the rear surface of the substrate to the bottom surface of the depressed portion. Consequently, it is possible to form the solder layer in such a way that at least the bottom surface and bottom surface corner portion (the eave portion) of the depressed portion and the circuit substrate are not joined. Consequently, even when the circuit substrate, or the like, expands due to a thermal shock, and stress is exerted on the substrate from the exterior, it is possible to prevent bending stress being exerted on the eave portion.

According to the tenth, fifteenth, and eighteenth aspects of the invention, it is possible to form a film covering the electrode on the bottom surface and bottom surface corner portion of the depressed portion, and it is possible to form the solder layer in such a way as to cover the flat portion (flat portion) of the rear surface of the substrate and the side wall of the depressed portion. For this reason, the junction area of the substrate and, for example, the Cu base for cooling joined thereto across the circuit substrate increases in comparison with a semiconductor device in which the solder layer is provided on only the flat portion of the rear surface of the substrate, and it is possible to improve heat radiation.

According to the semiconductor device and semiconductor device manufacturing method according to the invention, an advantage is obtained in that it is possible to prevent breakage and chipping of a semiconductor chip. Also, an advantage is obtained in that it is possible to prevent deterioration of device characteristics. Also, an advantage is obtained in that it is possible to improve the device characteristics.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
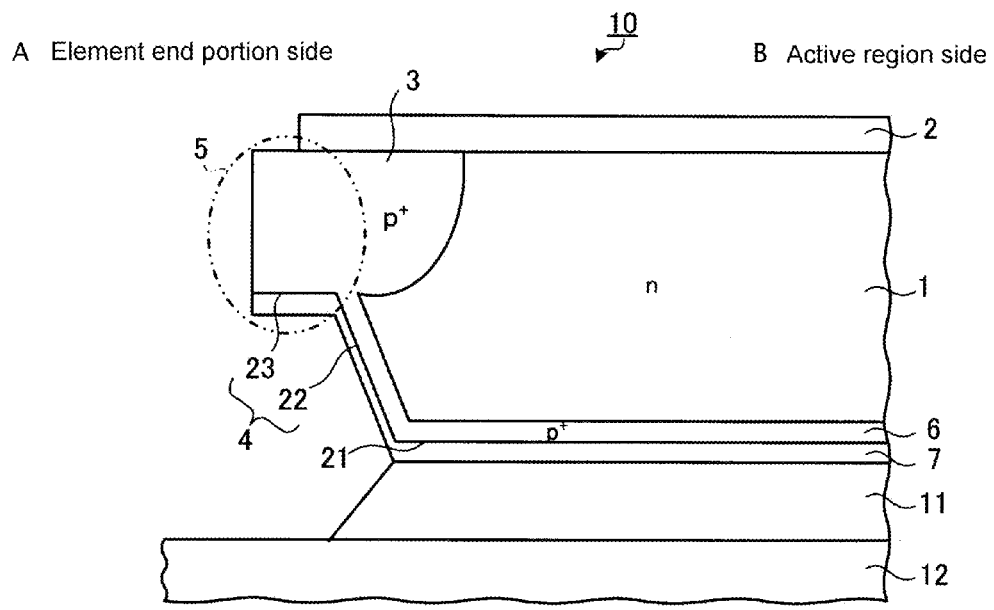
FIG. 1 is a sectional view showing a main portion of a semiconductor device according to a first embodiment.

Hereafter, referring to the attached drawings, a detailed description will be given of preferred embodiments of a semiconductor device and semiconductor device manufacturing method according to the invention. In the specification and the attached drawings, a marking of n or p means that a layer or region has a large number of electron or hole carriers, respectively. In the following description of the embodiments and in the attached drawings, the same reference numerals and characters are given to the same configurations, and a redundant description is omitted.

First Embodiment

FIG. 1 is a sectional view showing a main portion of a semiconductor device according to a first embodiment. The semiconductor device shown in FIG. 1 includes semiconductor chip 10, and insulating substrate (a circuit substrate) 12 such as a ceramic insulating substrate (a DBC substrate). A reverse blocking type of semiconductor element having bidirectional voltage resistance characteristics is formed on semiconductor chip 10. Specifically, front surface element structure 2 is provided on the front surface (first main surface) of n-type (first conductivity type) drift region 1 formed from semiconductor chip 10.

A metal oxide semiconductor (MOS) gate structure configured of a $p^+$-type base region, an $n^+$-type emitter region, an emitter electrode, a gate electrode, and the like, is provided on an active region side (element central portion side) as front surface element structure 2. Also, a voltage resistant structure configured of a field limiting ring (FLR), which is a floating p-type region, a field plate (FP), which is a floating conductive film, a passivation film, and the like, is provided on an element end portion side. $P^+$-type separation layer (a first semiconductor region) 3 is provided in a surface layer of drift region 1 on a side surface of the element end portion.

Depressed portion 4 reaching separation layer 3 is provided in an element end portion of the rear surface (second main surface) of semiconductor chip 10. That is, portion (eave portion) 5 of a thickness less than that of semiconductor chip 10 on the active region side is formed in the element end portion. Side wall 22 of depressed portion 4 is inclined with respect to, for example, the rear surface of semiconductor chip 10. Also, p-type collector layer (a second semiconductor region) 6 is provided on a surface layer of drift region 1, as a rear surface element structure of the reverse blocking type of semiconductor element, on the rear surface of semiconductor chip 10. Collector layer 6 extends to side wall 22 and bottom surface 23 of depressed portion 4, and is connected to separation layer 3.

Collector electrode 7 is provided over the whole surface of collector layer 6. That is, collector electrode 7 is provided not only on flat portion (a portion of the rear surface other than depressed portion 4: hereafter called the flat portion) 21 of the rear surface of semiconductor chip 10, but also extending to side wall 22 and bottom surface 23 of depressed portion 4. Also, collector electrode 7 is provided as a multilayer film (not shown) formed from at least more than one layer of electrode films.

The thickness of collector electrode 7 on side wall 22 of depressed portion 4 is less than the thickness of collector electrode 7 on flat portion 21 of the rear surface of semiconductor chip 10. Collector electrode 7 on side wall 22 of depressed portion 4 is such that the thickness of the outermost electrode film is 0.05 μm or less. Also, the thickness of collector electrode 7 on bottom surface 23 of depressed portion 4 may be less than the thickness of collector electrode 7 on flat portion 21 of the rear surface of semiconductor chip 10. Collector electrode 7 on bottom surface 23 of depressed portion 4 may be such that the thickness of the outermost electrode film is 0.05 μm or less.

Collector electrode 7 provided on the rear surface of semiconductor chip 10 is joined via solder layer 11 to a circuit pattern (a Cu pattern: not shown) formed from copper (Cu) or the like on insulating substrate 12. Solder layer 11 is provided in such a way as to cover collector electrode 7 provided on flat portion 21 of the rear surface of semiconductor chip 10. Solder layer 11 is not provided on side wall 22 and bottom surface 23 of depressed portion 4. That is, bottom surface 23 and bottom surface 23 corner portion (eave portion 5) of depressed portion 4 are not joined to the Cu pattern of insulating substrate 12 (hereafter called simply insulating substrate 12) by solder layer 11. Bottom surface 23 corner portion of depressed portion 4 is the boundary between side wall 22 and bottom surface 23 of depressed portion 4.

Solder layer 11 may cover collector electrode 7 provided extending from flat portion 21 of the rear surface of semiconductor chip 10 to the open end portion of depressed portion 4. In this case, from flat portion 21 of the rear surface of semiconductor chip 10 to the open end portion of depressed portion 4 is joined via solder layer 11 to insulating substrate 12. The surface of insulating substrate 12 opposite to the surface on which the Cu pattern is provided is joined by soldering to, for example, a Cu base (not shown) for cooling.

Figure 2:
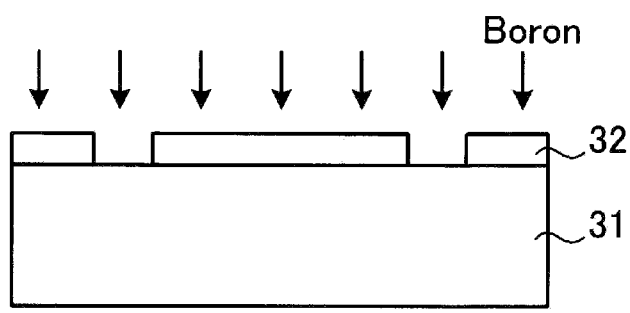
FIG. 2 is an illustration sequentially showing a semiconductor device manufacturing method according to the first embodiment.
Figure 3:
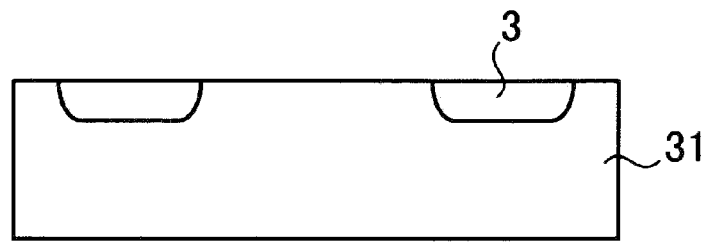
FIG. 3 is an illustration sequentially showing the semiconductor device manufacturing method according to the first embodiment.

Next, a description will be given of a semiconductor device manufacturing method according to the first embodiment. FIGS. 2 to 9 are illustrations sequentially showing the semiconductor device manufacturing method according to the first embodiment. Firstly, as shown in FIG. 2, a thermal oxide film ($SiO_2$) is formed on the front surface of n-type semiconductor wafer 31, forming oxide film mask 32 in which is opened a separation layer formation region. Then, with oxide film mask 32 as a mask, boron (B) is ion implanted as a dopant into the front surface of semiconductor wafer 31. Next, as shown in FIG. 3, after removing oxide film mask 32, a thermal processing is carried out using, for example, a diffusion furnace, forming separation layer 3 formed from a p-type diffusion layer (a first semiconductor region formation step).

Figure 4:
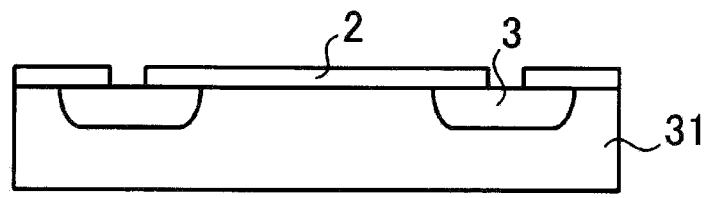
FIG. 4 is an illustration sequentially showing the semiconductor device manufacturing method according to the first embodiment.

As shown in FIG. 4, front surface element structure 2, such as an MOS gate structure or a voltage resistant structure, is formed in a region of the front surface of semiconductor wafer 31 in which separation layer 3 is not formed (a front surface element structure formation step). Then, the rear surface of semiconductor wafer 31 is ground in such a way that separation layer 3 is not exposed on the rear surface of semiconductor wafer 31, making semiconductor wafer 31 uniformly thinner.

Figure 5:
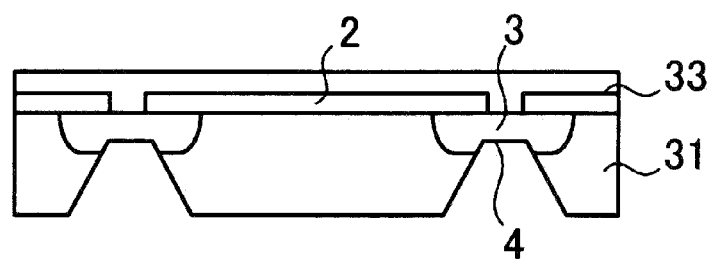
FIG. 5 is an illustration sequentially showing the semiconductor device manufacturing method according to the first embodiment.

As shown in FIG. 5, the front surface of semiconductor wafer 31 is covered with surface protection film 33, protecting front surface element structure 2 formed on the front surface of semiconductor wafer 31, separation layer 3, and the like. Subsequently, an oxide film mask (not shown) in which is opened depressed portion 4 formation region is formed on the rear surface of semiconductor wafer 31. Then, with the oxide film mask as a mask, depressed portion 4 reaching separation layer 3 is formed in the rear surface of semiconductor wafer 31 by a wet anisotropic etching using, for example, a tetramethylammonium hydroxide (TMAH) alkaline solution (a depressed portion formation step). Depressed portion 4 is formed on, for example, the scribe line of semiconductor wafer 31. Also, with the wet anisotropic etching using an alkaline solution, side wall 22 of depressed portion 4 is inclined at, for example, 54.7° with respect to the rear surface of semiconductor wafer 31 (refer to FIG. 1).

Figure 6:
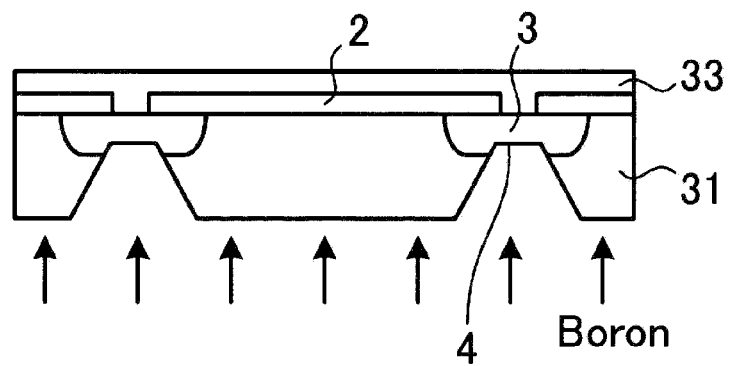
FIG. 6 is an illustration sequentially showing the semiconductor device manufacturing method according to the first embodiment.
Figure 7:
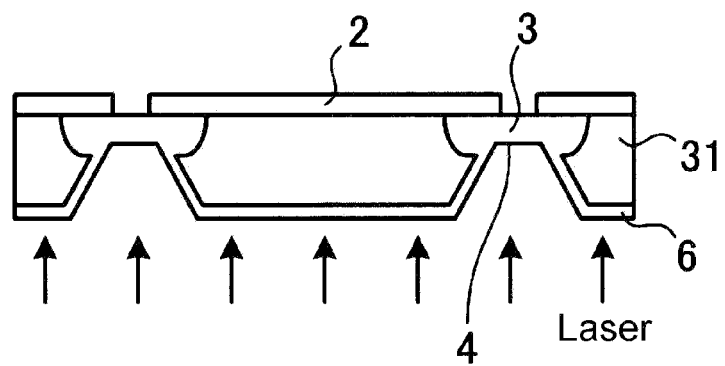
FIG. 7 is an illustration sequentially showing the semiconductor device manufacturing method according to the first embodiment.

As shown in FIG. 6, after removing the oxide film mask, boron is ion implanted as a dopant into the rear surface of semiconductor wafer 31. Next, as shown in FIG. 7, a laser annealing process is carried out on the rear surface of semiconductor wafer 31. By so doing, collector layer 6 extending to side wall 22 and bottom surface 23 of depressed portion 4, and connected to separation layer 3, is formed (a second semiconductor region formation step). Subsequently, the surface protection film (not shown) covering the front surface of semiconductor wafer 31 is removed.

Figure 8:
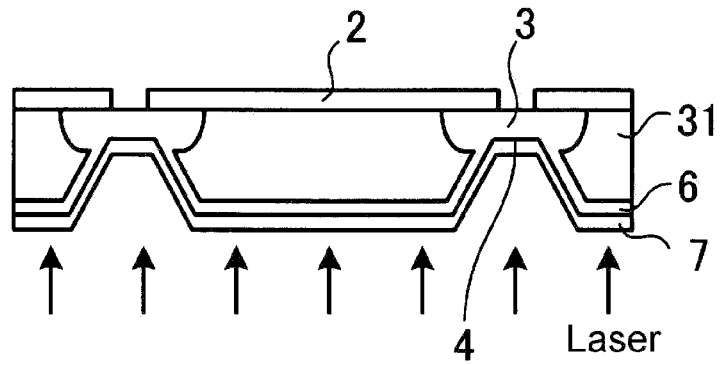
FIG. 8 is an illustration sequentially showing the semiconductor device manufacturing method according to the first embodiment.

Next, as shown in FIG. 8, collector electrode 7 formed from at least more than one layer of electrode films is formed over the whole of the rear surface of semiconductor wafer 31 using, for example, a chemical vapor deposition (CVD) or a physical vapor deposition (PVD) such as a sputtering method (an electrode formation step).

In the electrode formation step, collector electrode 7 is formed in such a way that the thickness of the outermost electrode film of collector electrode 7 on the side wall of depressed portion 4 is less than that of collector electrode 7 on flat portion 21 of the rear surface of semiconductor wafer 31. The thickness of the outermost electrode film of collector electrode 7 on side wall 22 of depressed portion 4 is 0.05 μm or less. For example, when collector electrode 7 is a multilayer film wherein an Al electrode film and a gold (Au) electrode film are stacked in that order, the thickness of the Au electrode film on side wall 22 of depressed portion 4 is 0.05 μm or less. The thickness of the outermost electrode film of collector electrode 7 on bottom surface 23 of depressed portion 4 may be 0.05 μm.

Specifically, when forming collector electrode 7 formed from a multilayer film in the electrode formation step, firstly, argon (Ar) gas is introduced into the chamber (not shown) of a sputtering device, and semiconductor wafer 31 is disposed on a positive electrode temperature controlled to 200° C. or less. The pressure inside the chamber is maintained at, for example, 0.1 Pa or more, 1.0 Pa or less. Then, an aluminum silicon (AlSi) electrode film is deposited on the rear surface of semiconductor wafer 31 as a lowermost first electrode film of collector electrode 7. The density of silicon in the AlSi electrode film may be, for example, 1% or less by weight. The thickness of the AlSi electrode film may be, for example, 550 nm.

Continuing, a titanium (Ti) electrode film and a nickel (Ni) electrode film are stacked, in that order, on the surface of the first electrode film as a second electrode film and third electrode film. The thickness of the Ti electrode film may be, for example, 75 nm. The thickness of the Ni electrode film may be, for example, 700 nm. Subsequently, a gold (Au) electrode film is formed on the surface of the third electrode film using a sputtering method. At this time, the thickness of the Au electrode film is adjusted in accordance with the angle formed by side wall 22 of depressed portion 4 formed in the rear surface of semiconductor wafer 31 and flat portion 21 of the rear surface of semiconductor wafer 31.

For example, when the angle formed by side wall 22 of depressed portion 4 and flat portion 21 of the rear surface of semiconductor wafer 31 is 54.7°, the thickness of the Au electrode film formed on flat portion 21 of the rear surface of semiconductor wafer 31 is adjusted to be in the region of 0.085 μm (=0.05 μm/cos(54.7°)). By so doing, it is possible to make the thickness of the Au electrode film on side wall 22 of depressed portion 4 in the region of 0.05 μm. Even when depressed portion 4 formation method differs from the heretofore described etching method, it is sufficient to set the thickness of the electrode film based on the inclination of side wall 22 of depressed portion 4.

By so doing, collector electrode 7 is formed over the whole surface of the collector layer 6. That is, collector electrode 7 is formed not only on flat portion (the portion of the rear surface other than depressed portion 4: the flat portion) 21 of the rear surface of semiconductor wafer 31, but also on side wall 22 and bottom surface 23 of depressed portion 4. Subsequently, a sintering is carried out using, for example, a laser, on the rear surface of semiconductor wafer 31, forming an ohmic contact in the interface between collector electrode 7 and semiconductor wafer 31.

Figure 9:
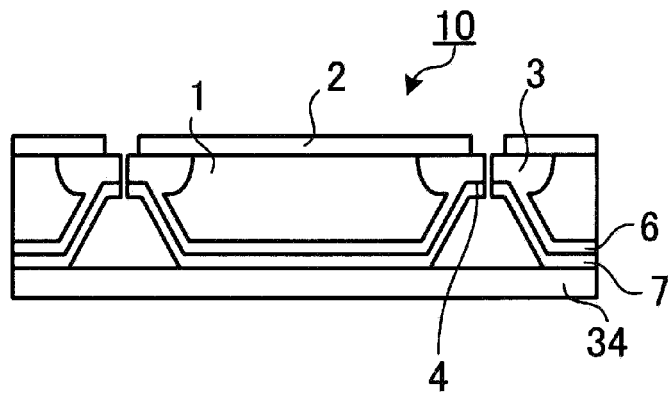
FIG. 9 is an illustration sequentially showing the semiconductor device manufacturing method according to the first embodiment.

As shown in FIG. 9, dicing tape 34 is affixed to the rear surface of the semiconductor wafer shown in FIG. 8, and semiconductor wafer 31 is placed on, for example, a flat support stand (not shown) with the rear surface side facing down. Then, the semiconductor wafer is diced along the scribe lines, and the semiconductor wafer is cut into individual semiconductor chips 10 (a cutting step).

Semiconductor chip 10 is mounted on insulating substrate 12 on which is printed, for example, a paste solder. At this time, it is preferable that the paste solder is applied to an extent such that only flat portion 21 of the rear surface of semiconductor chip 10 is joined by soldering to insulating substrate 12. Next, the solder is melted by, for example, directly heating insulating substrate 12, forming solder layer 11. By so doing, semiconductor chip 10 is joined to insulating substrate 12 via solder layer 11 (a joining step). With the step described above, the semiconductor device shown in FIG. 1 is completed.

It is desirable that the outermost electrode film of collector electrode 7 on flat portion 21 of the rear surface of the semiconductor wafer is formed to a thickness of more than 0.05 μm. By so doing, it is possible to improve the solder wettability in flat portion 21 of the rear surface of semiconductor chip 10. Consequently, it is possible to form solder layer 11 uniformly on flat portion 21 of the rear surface of semiconductor chip 10, and it is possible to join semiconductor chip 10 and insulating substrate 12 well.

As heretofore described, according to the first embodiment, it is possible to worsen the solder wettability in side wall 22 and bottom surface 23 of depressed portion 4 by making the thickness of the outermost electrode film of collector electrode 7 on side wall 22 and bottom surface 23 of depressed portion 4 to be 0.05 μm or less. For this reason, at least bottom surface 23 and bottom surface 23 corner portion (eave portion 5) of depressed portion 4 are not joined to insulating substrate 12 by solder layer 11. Because of this, even in the event that insulating substrate 12 or the like expands due to thermal shock, and stress is exerted on semiconductor chip 10 from the exterior, it is possible to prevent bending stress from being exerted on eave portion 5, and it is possible to prevent a crack from forming in eave portion 5. Consequently, it is possible to prevent breakage or chipping from occurring in the element end portion of semiconductor chip 10. Also, as it is possible to prevent bending stress from being exerted on eave portion 5, it is possible to prevent cracking or detachment from occurring in the FP or passivation film provided on eave portion 5. Because of this, it is possible to prevent the device characteristics of the semiconductor device from deteriorating. Also, in the electrode formation step, the outermost electrode film of collector electrode 7 on side wall 22 of depressed portion 4 is formed in such a way that the thickness thereof is 0.05 μm or less. For this reason, it is possible to worsen the solder wettability in side wall 22 of depressed portion 4. Because of this, it does not happen in the joining step that the melted solder creeps up from flat portion 21 side of the rear surface of semiconductor chip 10 to side wall 22 of depressed portion 4. Consequently, it is possible to form solder layer 11 in such a way that bottom surface 23 and bottom surface 23 corner portion (eave portion 5) of depressed portion 4 and insulating substrate 12 are not joined. By so doing, it is possible to form a semiconductor device (refer to FIG. 1) having the heretofore described advantages.

Second Embodiment

Figure 10:
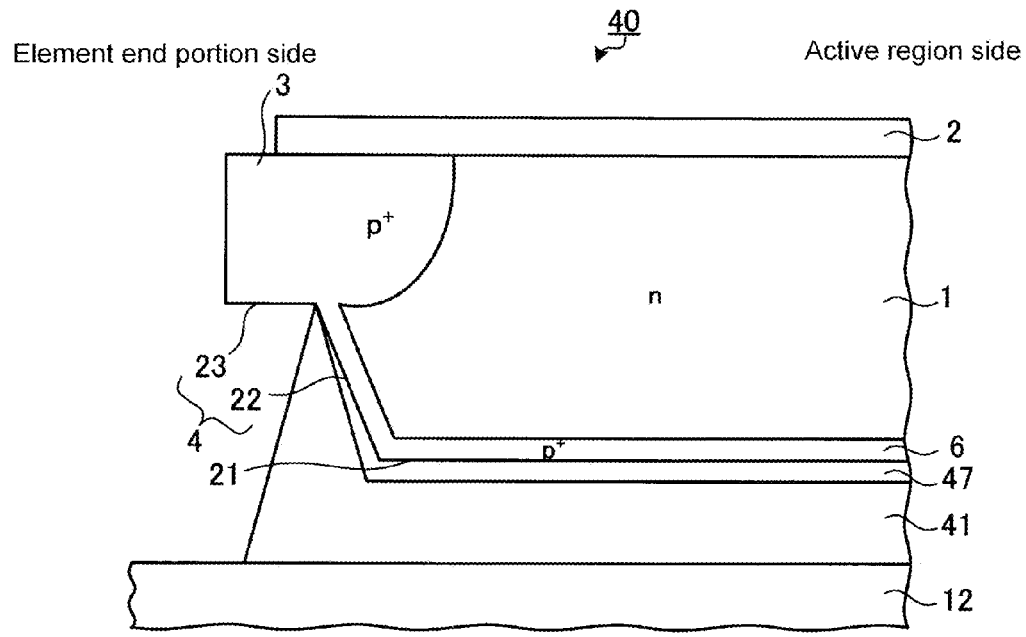
FIG. 10 is a sectional view showing a main portion of a semiconductor device according to a second embodiment.

FIG. 10 is a sectional view showing a main portion of a semiconductor device according to a second embodiment. In the second embodiment, the configuration may be such that collector electrode 7 is not provided on bottom surface 23 of depressed portion 4.

In the second embodiment, as shown in FIG. 10, collector electrode 47 is provided extending from flat portion 21 of the rear surface of semiconductor chip 40 to side wall 22 of depressed portion 4. That is, collector electrode 47 is not provided on bottom surface 23 or bottom surface 23 corner portion of depressed portion 4. The thickness of collector electrode 47 may be a uniform thickness on both flat portion 21 of the rear surface of semiconductor chip 40 and side wall 22 of depressed portion 4, or the thickness on side wall 22 of depressed portion 4 may become gradually less from an open end portion side to bottom surface 23 corner portion of depressed portion 4. Also, collector electrode 47 may be a multilayer film.

Solder layer 41 covers collector electrode 47 exposed on the rear surface side of semiconductor chip 40. That is, solder layer 41 is provided in such a way as to cover flat portion 21 of the rear surface of semiconductor chip 40 and side wall 22 of depressed portion 4, and is not provided on bottom surface 23 of depressed portion 4. For this reason, bottom surface 23 and bottom surface 23 corner portion (an eave portion) of depressed portion 4 are not joined by solder layer 41 to an insulating substrate 12. Configurations other than this are the same as those of the semiconductor device of the first embodiment (refer to FIG. 1).

Figure 11:
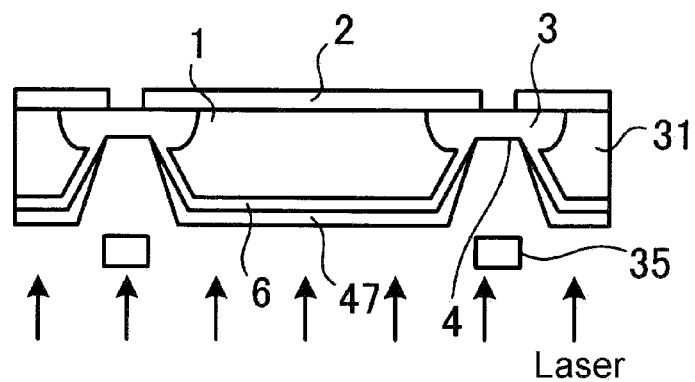
FIG. 11 is an illustration sequentially showing a semiconductor device manufacturing method according to the second embodiment.
Figure 12:
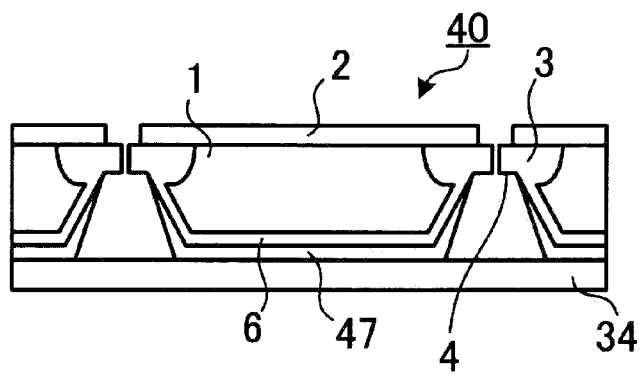
FIG. 12 is an illustration sequentially showing the semiconductor device manufacturing method according to the second embodiment.

Next, a description will be given of a semiconductor device manufacturing method according to the second embodiment. FIGS. 11 and 12 are illustrations sequentially showing the semiconductor device manufacturing method according to the second embodiment. Firstly, in the same way as in the first embodiment, a first semiconductor region formation step, a front surface element structure formation step, a depressed portion formation step, and a second semiconductor region formation step are carried out (refer to FIGS. 1 to 7). Next, as shown in FIG. 11, mask 35 covering bottom surface 23 and bottom surface 23 corner portion of depressed portion 4 is formed (a mask formation step).

With mask 35 as a mask, collector electrode 47 is formed on the surface of collector layer 6 using, for example, a CVD or PVD (an electrode formation step). Then, in the same way as in the first embodiment, a sintering is carried out using, for example, a laser. In the electrode formation step, by using mask 35, collector electrode 47 is not formed on bottom surface 23 or bottom surface 23 corner portion of depressed portion 4. Herein, in order to clarify the condition of semiconductor wafer 31 after the formation of collector electrode 47, mask 35 is shown in the drawing in such a way that it is not in contact with semiconductor wafer 31.

Also, in the electrode formation step, when collector electrode 47 is a multilayer film, a configuration may be such that only the outermost electrode film formed from, for example, a metal material with good solder wettability is not formed on bottom surface 23 of depressed portion 4. Specifically, when forming, for example, an Al electrode film and an Au electrode film, in that order, as collector electrode 47, the Al electrode film is formed over the whole surface of collector layer 6. Then, the Au electrode film is formed on flat portion 21 of the rear surface of semiconductor wafer 31 and side wall 22 of depressed portion 4. In this case, the mask formation step may be carried out partway through the electrode formation step, for example, mask 35 may be formed after forming the Al electrode film and before forming the Au electrode film.

Next, as shown in FIG. 12, the semiconductor wafer is cut into individual semiconductor chips 40 (a cutting step), in the same way as in the first embodiment. Next, in the same way as in the first embodiment, semiconductor chip 40 is joined to insulating substrate 12 via solder layer 41 (a joining step). By so doing, the semiconductor device shown in FIG. 10 is completed.

As heretofore described, according to the second embodiment, it is possible to worsen the solder wettability in bottom surface 23 and bottom surface 23 corner portion of depressed portion 4 by not providing collector electrode 47 on bottom surface 23 and bottom surface 23 corner portion of depressed portion 4. Because of this, it does not happen in the joining step that the melted solder creeps up from bottom surface 23 corner portion of depressed portion 4 to bottom surface 23 side. Because of this, it is possible to obtain the same advantages as in the first embodiment. Also, solder layer 41 is provided in such a way as to cover flat portion 21 of the rear surface of semiconductor chip 40 and side wall 22 of depressed portion 4. For this reason, the junction area of semiconductor chip 40 and collector electrode 7 increases in comparison with a semiconductor device in which the solder layer is provided on only the flat portion of the rear surface of the semiconductor chip, and it is possible to improve heat radiation. Because of this, it is possible to improve the device characteristics of the semiconductor device.

Third Embodiment

Figure 13:
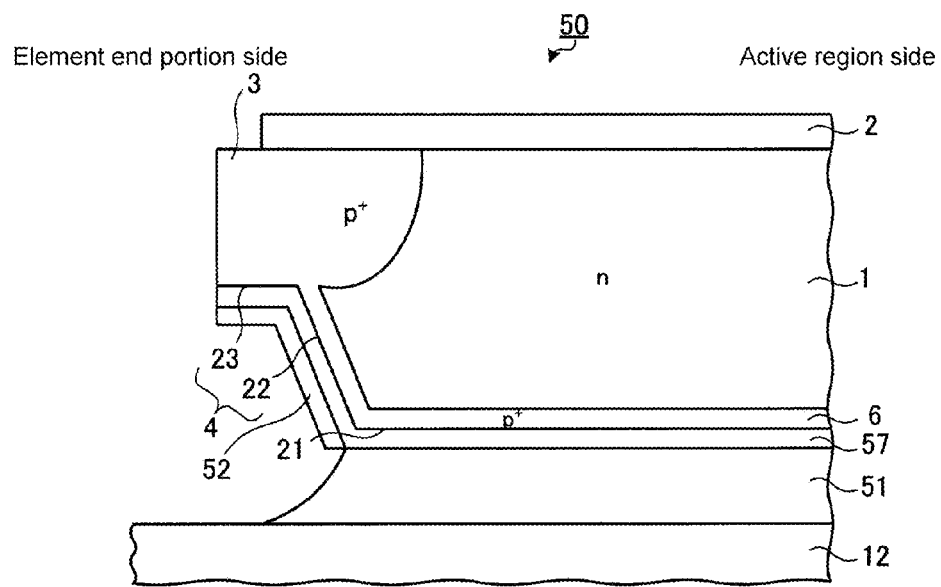
FIG. 13 is a sectional view showing a main portion of a semiconductor device according to a third embodiment.

FIG. 13 is a sectional view showing a main portion of a semiconductor device according to a third embodiment. In the first embodiment, a configuration may be such that the collector electrode provided on side wall 22 and bottom surface 23 of depressed portion 4 is covered with a polyimide resin film.

In the third embodiment, as shown in FIG. 13, collector electrode 57 is provided extending from flat portion 21 of the rear surface of semiconductor chip 50 to bottom surface 23 of depressed portion 4. The thickness of collector electrode 57 may be a uniform thickness from flat portion 21 of the rear surface of semiconductor chip 50 to bottom surface 23 of depressed portion 4. Also, collector electrode 57 may be a multilayer film. Collector electrode 57 on side wall 22 and bottom surface 23 of depressed portion 4 is covered with film 52 formed from a material with poor solder wettability. Film 52 formed from a material with poor solder wettability may be, for example, a polyimide resin film, or may be a film formed from a spin-on-glass (SOG).

Solder layer 51 covers collector electrode 57 exposed on the rear surface side of semiconductor chip 50. That is, solder layer 51 is provided in such a way as to cover flat portion 21 of the rear surface of semiconductor chip 50, and is not provided on film 52 formed from a material with poor solder wettability. For this reason, bottom surface 23 and bottom surface 23 corner portion (an eave portion) of depressed portion 4 are not joined by solder layer 51 to insulating substrate 12. Configurations other than this are the same as those of the semiconductor device of the first embodiment (refer to FIG. 1).

Next, a description will be given of a semiconductor device manufacturing method according to the third embodiment. FIGS. 14 to 17 are illustrations sequentially showing the semiconductor device manufacturing method according to the third embodiment. Firstly, in the same way as in the first embodiment, a first semiconductor region formation step, a front surface element structure formation step, a depressed portion formation step, and a second semiconductor region formation step are carried out (refer to FIGS. 1 to 7

Figure 14:
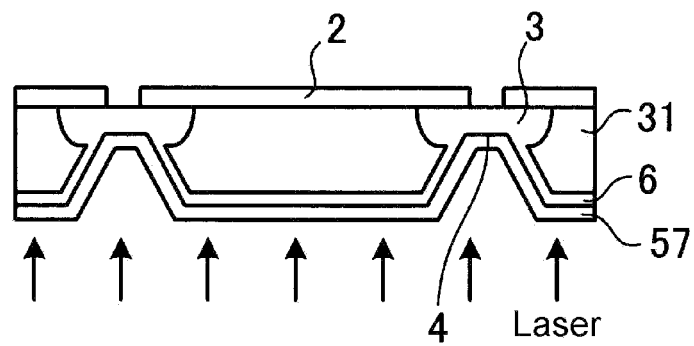
FIG. 14 is an illustration sequentially showing a semiconductor device manufacturing method according to the third embodiment.

Next, as shown in FIG. 14, collector electrode 57 is formed over the whole of the rear surface of semiconductor wafer 31 using, for example, a CVD or PVD (an electrode formation step). By so doing, collector electrode 57 is formed from flat portion 21 of the rear surface of semiconductor wafer 31 to bottom surface 23 of depressed portion 4. The thickness of collector electrode 57 may be uniform over the whole of the rear surface of semiconductor wafer 31. Subsequently, in the same way as in the first embodiment, a sintering is carried out using, for example, a laser.

Figure 15:
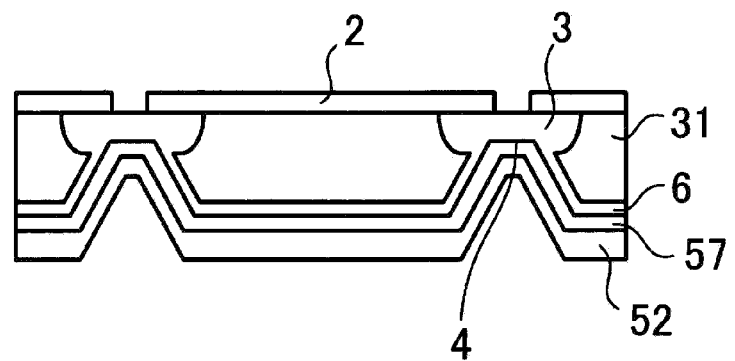
FIG. 15 is an illustration sequentially showing the semiconductor device manufacturing method according to the third embodiment.
Figure 16:
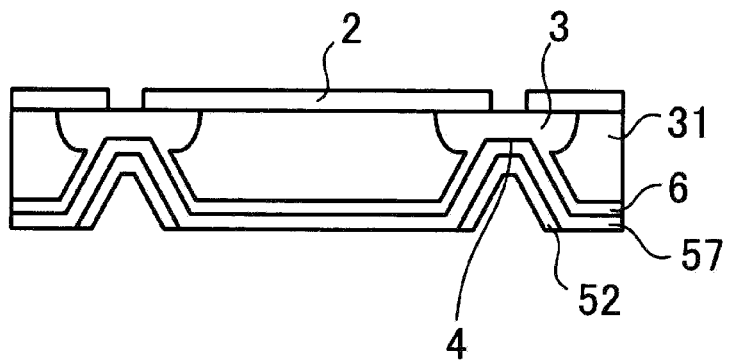
FIG. 16 is an illustration sequentially showing the semiconductor device manufacturing method according to the third embodiment.

Next, as shown in FIG. 15, film 52 formed from a material with poor solder wettability is formed over the whole of the surface of collector electrode 57 (a first film formation step). In the first film formation step, for example, a polyimide resin film may be formed as film 52 formed from a material with poor solder wettability. In this case, after applying the polyimide resin over the whole of the surface of collector electrode 57 using, for example, a spin coater, a polyimide resin hardening process is carried out. Next, as shown in FIG. 16, film 52 formed from a material with poor solder wettability is removed, leaving it on only side wall 22 and bottom surface 23 of depressed portion 4 (a removal step).

Figure 17:
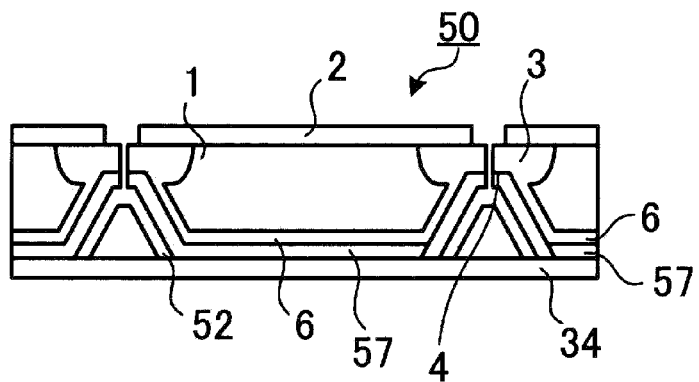
FIG. 17 is an illustration sequentially showing the semiconductor device manufacturing method according to the third embodiment.

As shown in FIG. 17, the semiconductor wafer is cut into individual semiconductor chips 50 (a cutting step), in the same way as in the first embodiment. Next, in the same way as in the first embodiment, semiconductor chip 50 is joined to insulating substrate 12 via the solder layer 51 (a joining step). By so doing, the semiconductor device shown in FIG. 13 is completed.

As heretofore described, according to the third embodiment, it is possible to worsen the solder wettability in side wall 22 and bottom surface 23 of depressed portion 4 by providing film 52 formed from a material with poor solder wettability on side wall 22 and bottom surface 23 of depressed portion 4. Because of this, it is possible to obtain the same advantages as in the first embodiment.

Fourth Embodiment

Figure 18:
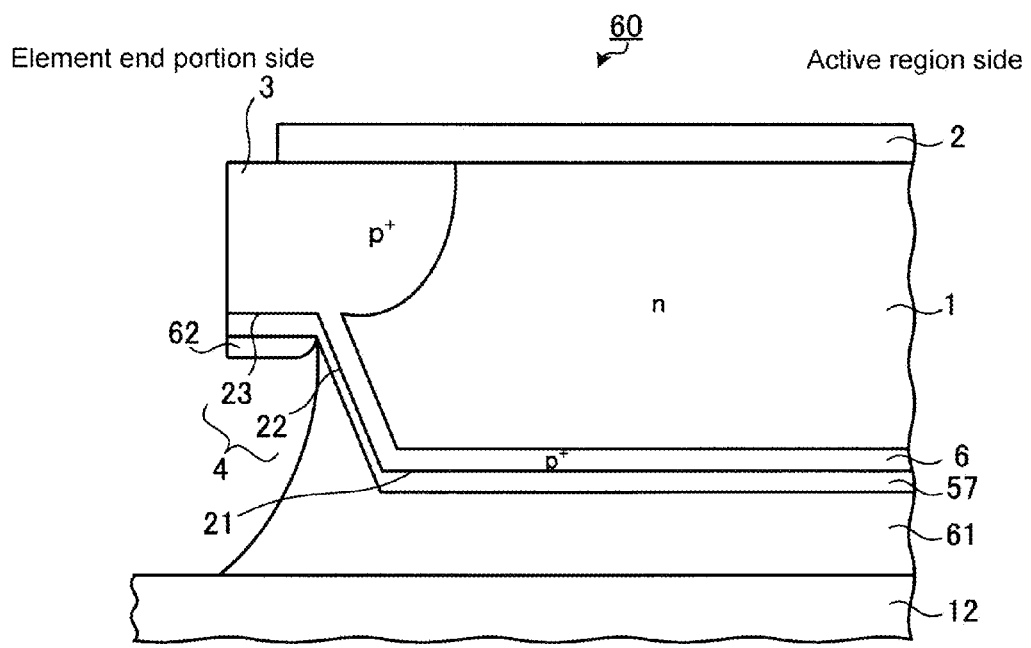
FIG. 18 is a sectional view showing a main portion of a semiconductor device according to a fourth embodiment.

FIG. 18 is a sectional view showing a main portion of a semiconductor device according to a fourth embodiment. In the third embodiment, a configuration may be such that only the collector electrode provided on bottom surface 23 and bottom surface 23 corner portion of depressed portion 4 is covered with a polyimide resin film.

In the fourth embodiment, as shown in FIG. 18, collector electrode 57 on bottom surface 23 and bottom surface 23 corner portion of depressed portion 4 is covered with film 62 formed from a material with poor solder wettability. Film 62 formed from a material with poor solder wettability covers only collector electrode 57 provided on bottom surface 23 and bottom surface 23 corner portion of depressed portion 4. Solder layer 61 is provided in such a way as to cover flat portion 21 of the rear surface of semiconductor chip 60 and side wall 22 of depressed portion 4, and is not provided on film 62 formed from a material with poor solder wettability. For this reason, bottom surface 23 and bottom surface 23 corner portion (an eave portion) of depressed portion 4 are not joined by solder layer 61 to insulating substrate 12. Configurations other than this are the same as those of the semiconductor device of the third embodiment (refer to FIG. 13).

Figure 19:
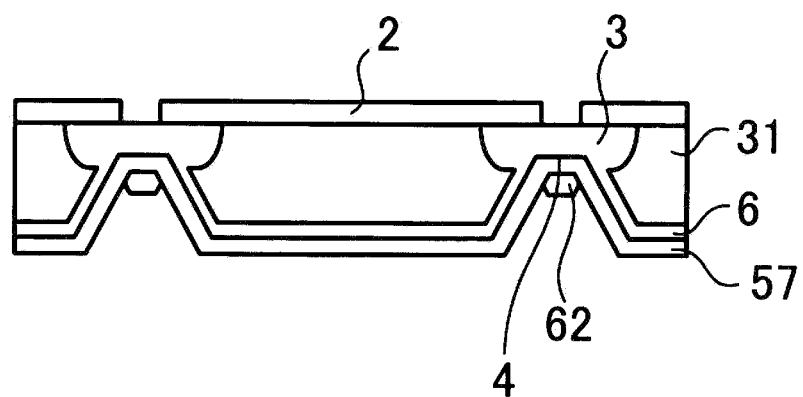
FIG. 19 is an illustration sequentially showing a semiconductor device manufacturing method according to the fourth embodiment.
Figure 20:
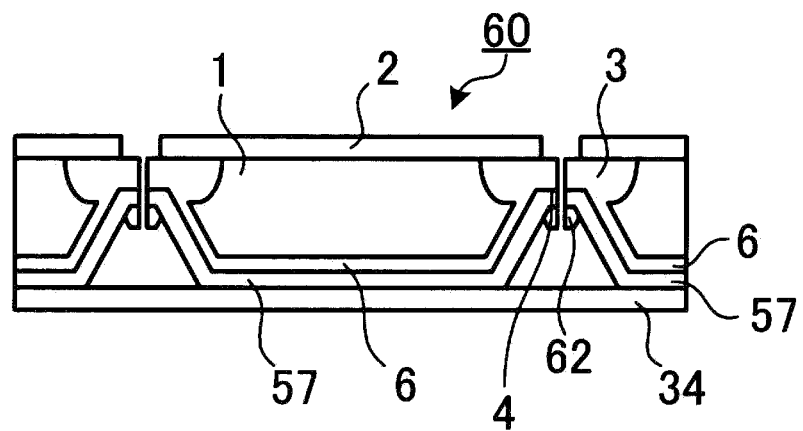
FIG. 20 is an illustration sequentially showing the semiconductor device manufacturing method according to the fourth embodiment.

Next, a description will be given of a semiconductor device manufacturing method according to the fourth embodiment. FIGS. 19 and 20 are illustrations sequentially showing the semiconductor device manufacturing method according to the fourth embodiment. Firstly, in the same way as in the first embodiment, a first semiconductor region formation step, a front surface element structure formation step, a depressed portion formation step, and a second semiconductor region formation step are carried out (refer to FIGS. 1 to 7). Next, in the same way as in the third embodiment, an electrode formation step is carried out (refer to FIG. 14).

In the same way as in the third embodiment, film 62 formed from a material with poor solder wettability is formed over the whole of the surface of collector electrode 57 in a first film formation step (refer to FIG. 15). Next, as shown in FIG. 19, film 62 formed from a material with poor solder wettability is removed, leaving it on only bottom surface 23 and bottom surface 23 corner portion of depressed portion 4 (a removal step).

As shown in FIG. 20, the semiconductor wafer is cut into individual semiconductor chips 60 (a cutting step), in the same way as in the first embodiment. Next, in the same way as in the first embodiment, semiconductor chip 60 is joined to insulating substrate 12 via solder layer 61 (a joining step). By so doing, the semiconductor device shown in FIG. 18 is completed.

As heretofore described, according to the fourth embodiment, it is possible to worsen the solder wettability in bottom surface 23 and bottom surface 23 corner portion of depressed portion 4 by providing film 62 formed from a material with poor solder wettability on bottom surface 23 and bottom surface 23 corner portion of depressed portion 4. Because of this, it does not happen in the joining step that the melted solder creeps up from bottom surface 23 corner portion of depressed portion 4 to bottom surface 23 side. Because of this, it is possible to obtain the same advantages as in the first to third embodiments. Also, as solder layer 61 is provided in such a way as to cover flat portion 21 of the rear surface of the semiconductor chip 60 and side wall 22 of depressed portion 4, it is possible to obtain the same advantages as in the second embodiment.

Fifth Embodiment

Figure 21:
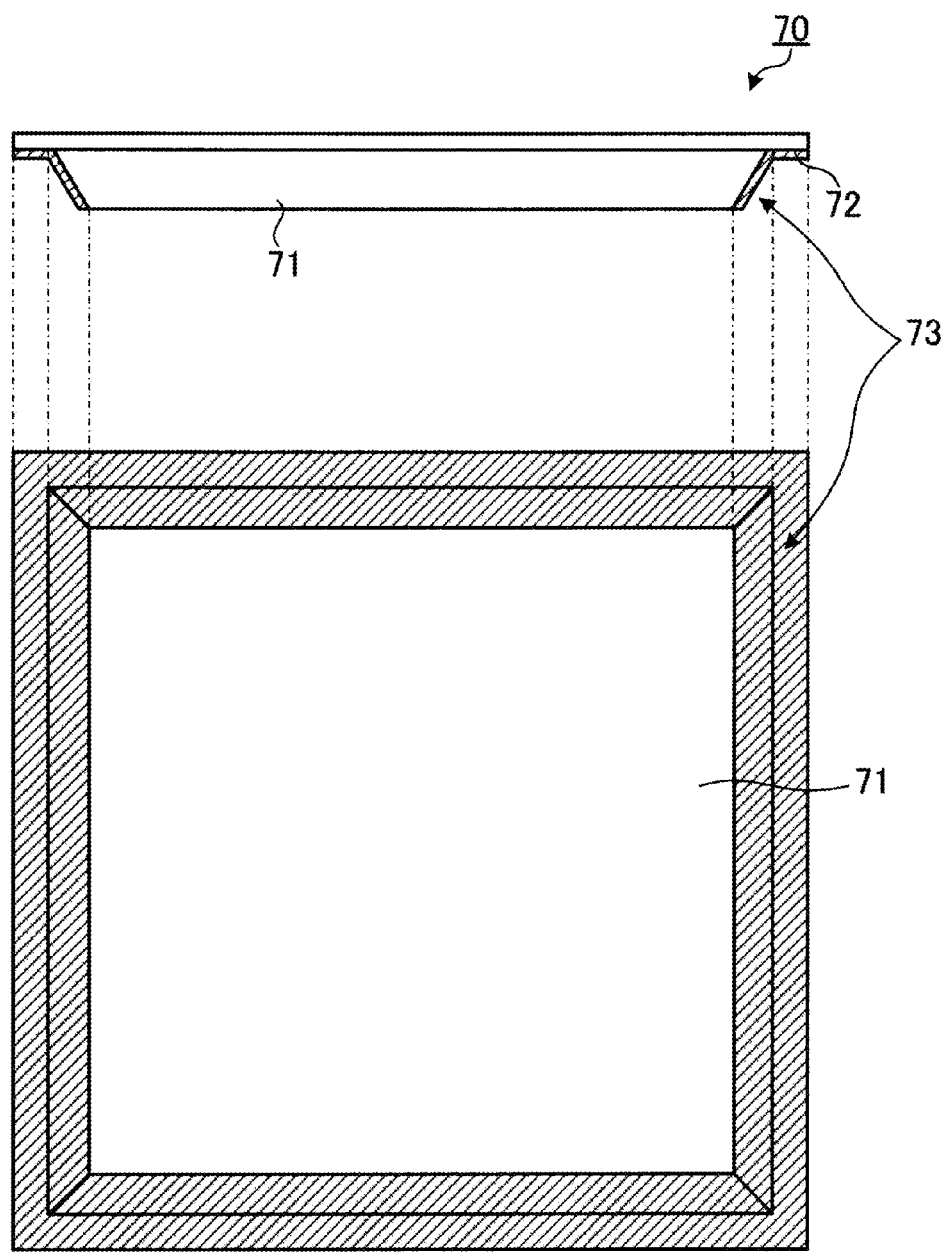
FIG. 21 is an illustration sequentially showing a semiconductor device manufacturing method according to a fifth embodiment.

FIG. 21 is an illustration showing a semiconductor device manufacturing method according to a fifth embodiment. In the third embodiment, the film formed from a material with poor solder wettability may be formed from the outset on only the side wall and bottom surface of the depressed portion, without being formed over the whole of the rear surface of the semiconductor wafer.

In the fifth embodiment, firstly, in the same way as in the first embodiment, a first semiconductor region formation step, a front surface element structure formation step, a depressed portion formation step, and a second semiconductor region formation step are carried out (refer to FIGS. 1 to 7). Next, in the same way as in the third embodiment, an electrode formation step is carried out (refer to FIG. 14). Next, as shown in FIG. 21, a material with poor solder wettability is applied to only desired portions of the rear surface of semiconductor wafer 70 using, for example, a dispenser or ink jet. That is, without the material with poor solder wettability being applied from the outset to surface 71 on which is carried out a solder joining of the rear surface of semiconductor wafer 70, the material with poor solder wettability is applied to only a side wall and bottom surface of depressed portion 72. By so doing, film 73 formed from a material with poor solder wettability is formed on the side wall and bottom surface of depressed portion 72 (a second film formation step). Next, in the same way as in the third embodiment, a cutting step and a joining step are carried out (refer to FIG. 17), and the semiconductor device shown in, for example, FIG. 13, is completed.

In the second film formation step, a polyimide resin film may be formed as film 73 formed from a material with poor solder wettability. In this case, a polyimide resin hardening process may be carried out after finishing the application of the polyimide resin to all the desired portions of the rear surface of semiconductor wafer 70, or the polyimide resin hardening process may be carried out at the same time as the polyimide resin is applied to the rear surface of semiconductor wafer 70.

In the second film formation step, a material with poor solder wettability may be applied to only the bottom surface and a bottom surface corner portion of depressed portion 72. In this case, a film formed from a material with poor solder wettability is formed on only the bottom surface and bottom surface corner portion of depressed portion 72. Subsequently, in the same way as in the fourth embodiment, a cutting step and a joining step are carried out (refer to FIG. 20), and the semiconductor device shown in, for example, FIG. 18, is completed.

As heretofore described, according to the fifth embodiment, the film formed from a material with poor solder wettability is formed on at least the bottom surface and bottom surface corner portion of depressed portion 72. Because of this, it is possible to obtain the same advantages as in the third and fourth embodiments. Also, as the material with poor solder wettability is applied to only the desired portions, there is no need to carry out a process of removing the material with poor solder wettability applied to an unnecessary portion. For this reason, it is possible to reduce the manufacturing steps. Also, it is possible to reduce the amount of solder removed and thrown away. Because of this, it is possible to reduce the manufacturing cost.

WORKING EXAMPLE 1

Figure 30:
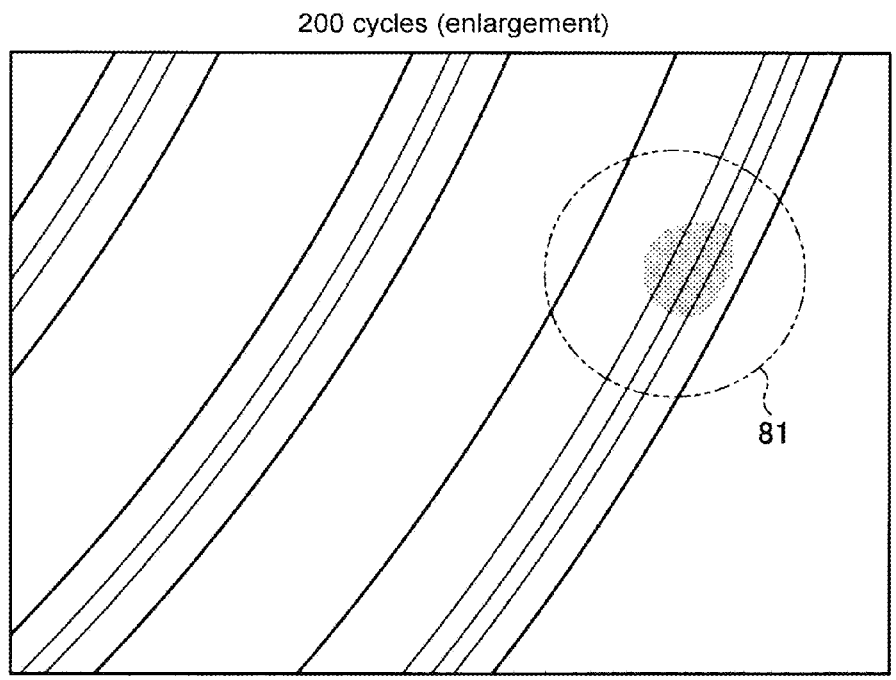
FIG. 30 is a conceptual diagram showing an enlargement of one portion of a planar form of an outermost peripheral portion of a passivation film shown in FIG. 29.
Figure 31:
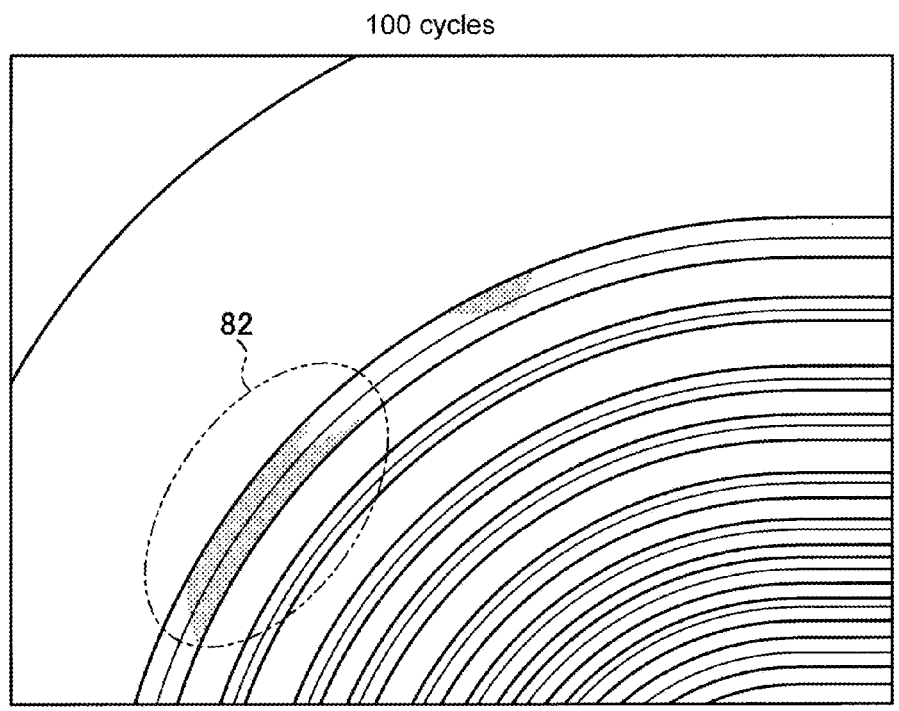
FIG. 31 is a conceptual diagram schematically showing a planar form of the front surface of an element end portion of a semiconductor chip after a temperature and humidity test.
Figure 32:
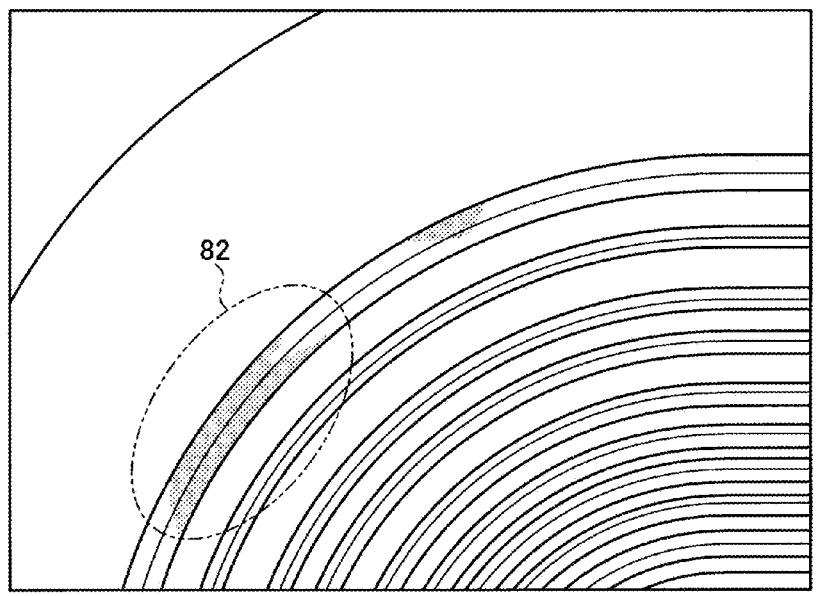
FIG. 32 is a conceptual diagram schematically showing a planar form of the front surface of an element end portion of a semiconductor chip after a temperature and humidity test.
Figure 33:
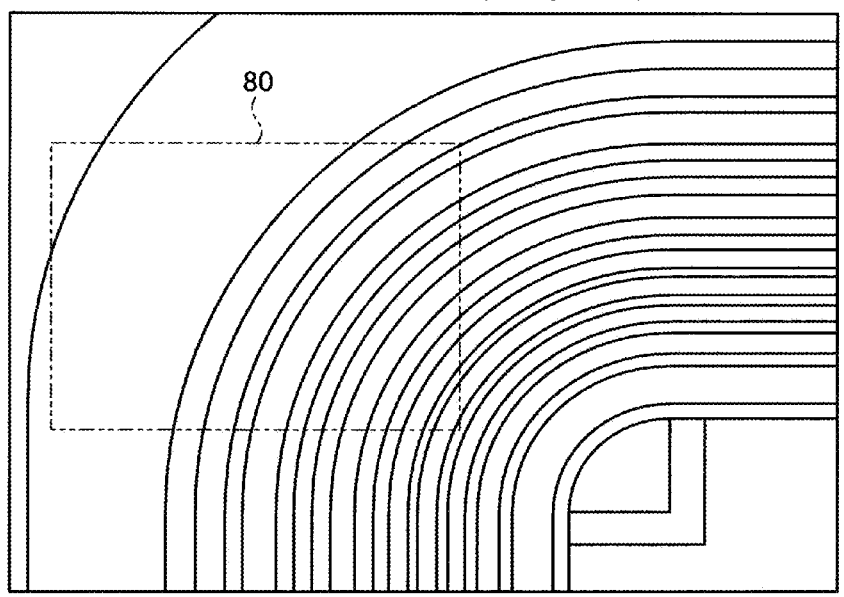
FIG. 33 is a conceptual diagram showing an enlargement of one portion of a planar form of an outermost peripheral portion of a passivation film shown in FIG. 32.

FIGS. 22 to 27, 29, 31, and 32 are conceptual diagrams schematically showing a planar form of the front surface of an element end portion of a semiconductor chip after a temperature and humidity (H/S) test. Also, FIGS. 28, 30, and 33 are conceptual diagrams showing an enlargement of one portion of a planar form of an outermost peripheral portion of a passivation film shown in FIGS. 27, 29, and 32, respectively. Firstly, a semiconductor device mounted with a semiconductor chip on which is formed a reverse blocking type of semiconductor element is fabricated in accordance with the third and fourth embodiments (refer to FIGS. 13 and 18) (hereafter called first and second working examples).

In the first working example, collector electrode 57 is formed by sputtering. Side wall 22 and bottom surface 23 of depressed portion 4 are covered with a polyimide resin film (film 52 formed from a material with poor solder wettability). As an FP formed on the semiconductor chip as a voltage resistant structure, a metal electrode formed from an Al alloy is formed. A nitride film is formed as a passivation film covering the FP. Also, in the second working example, only a bottom surface 23 of depressed portion 4 is covered with a polyimide resin film (film 62 formed from a material with poor solder wettability). Conditions other than this are the same as those in the first working example.

Figure 36:
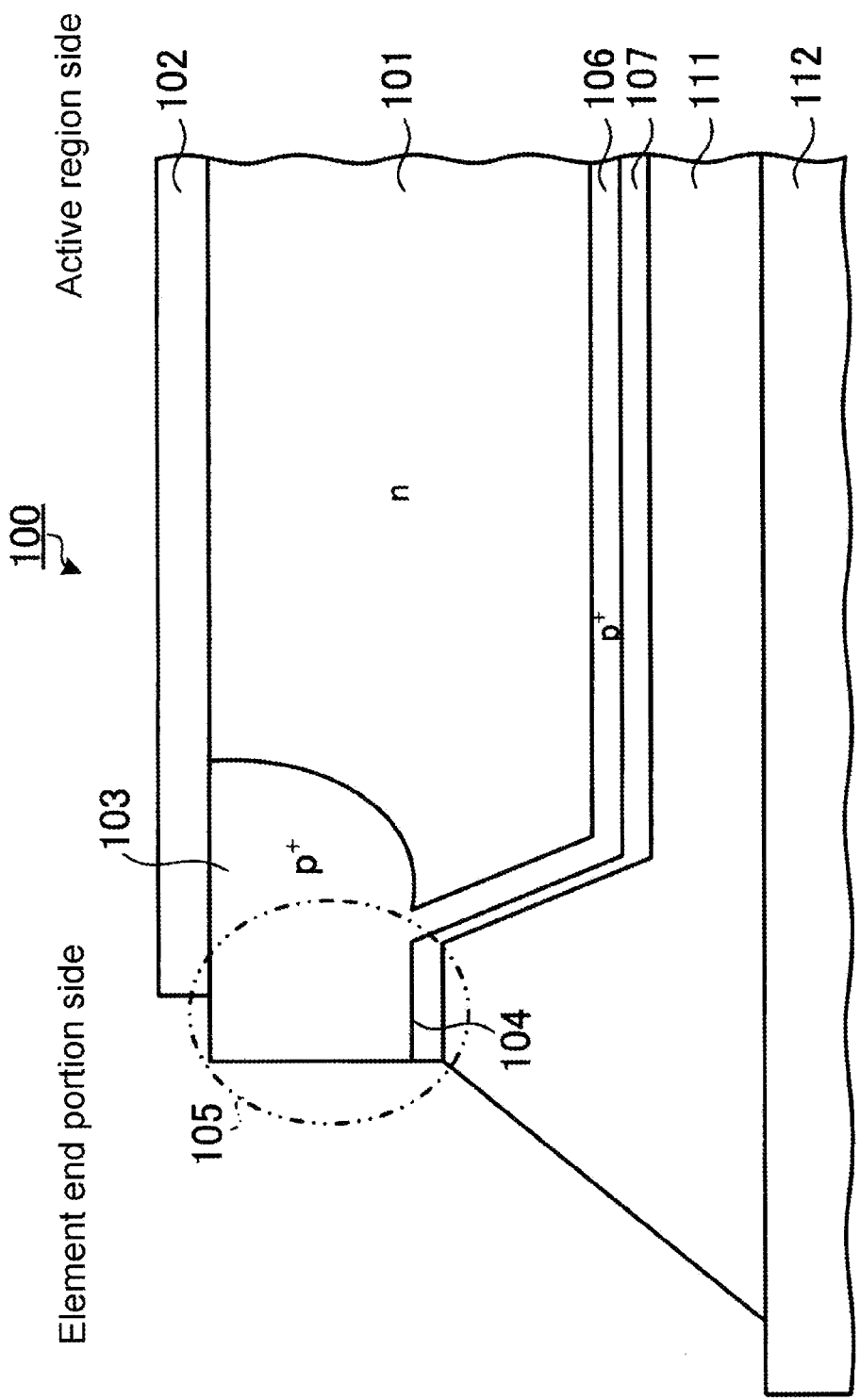
FIG. 36 is a sectional view showing a main portion of a structure of a heretofore known semiconductor device.
Figure 37:
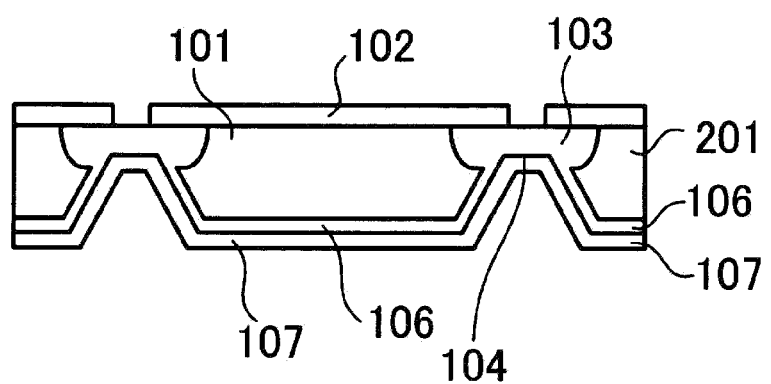
FIG. 37 is an illustration sequentially showing a heretofore known semiconductor device manufacturing method.
Figure 38:
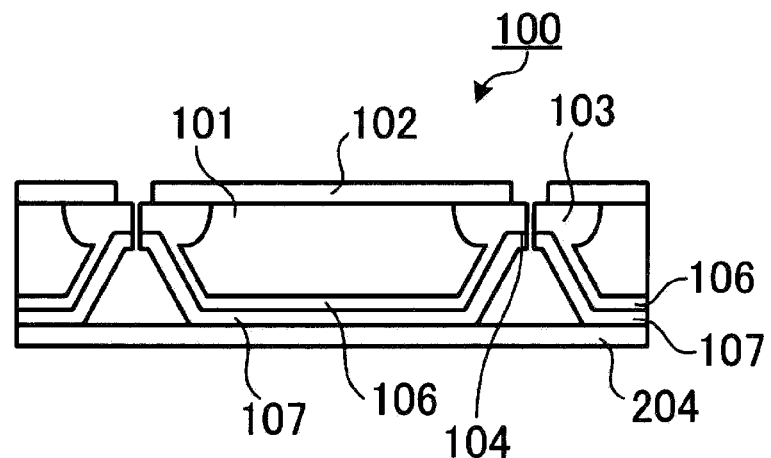
FIG. 38 is an illustration sequentially showing the heretofore known semiconductor device manufacturing method.

A semiconductor device mounted with a semiconductor chip wherein only an element end portion side of a bottom surface of a depressed portion is covered with a polyimide resin film is fabricated as a comparison (hereafter called a comparison example). In the comparison example, a bottom surface corner portion side of the depressed portion is not covered with the polyimide resin film. Then, from a flat portion of the rear surface of the semiconductor chip to the bottom surface corner portion side of the depressed portion is joined via a solder layer to an insulating substrate. Conditions other than this are the same as those in the first working example. Also, a heretofore known semiconductor device wherein the whole of the rear surface of a semiconductor chip is joined to an insulating substrate via a solder layer (refer to FIG. 36) is fabricated (hereafter called a first heretofore known example). In the first heretofore known example, no polyimide resin film is formed on a side wall or bottom surface of the depressed portion. Conditions other than this are the same as those in the first working example.

A common liquid tank type temperature and humidity (H/S) test is carried out on the first and second working examples, comparison example, and first heretofore known example, the semiconductor device is exposed to an environment in which the temperature rapidly changes, and the resistance characteristics of the semiconductor device are evaluated. Specifically, as the testing conditions of the H/S test, the temperature is taken to be −40 to 125° C., one cycle is taken to be 40 minutes, and the resistance characteristics of the semiconductor device after 100 cycles and after 200 cycles are evaluated. A fluorine series heat medium (a perfluoropolyester compound: PPFE) is used as a solvent in the liquid tank.

Figure 22:
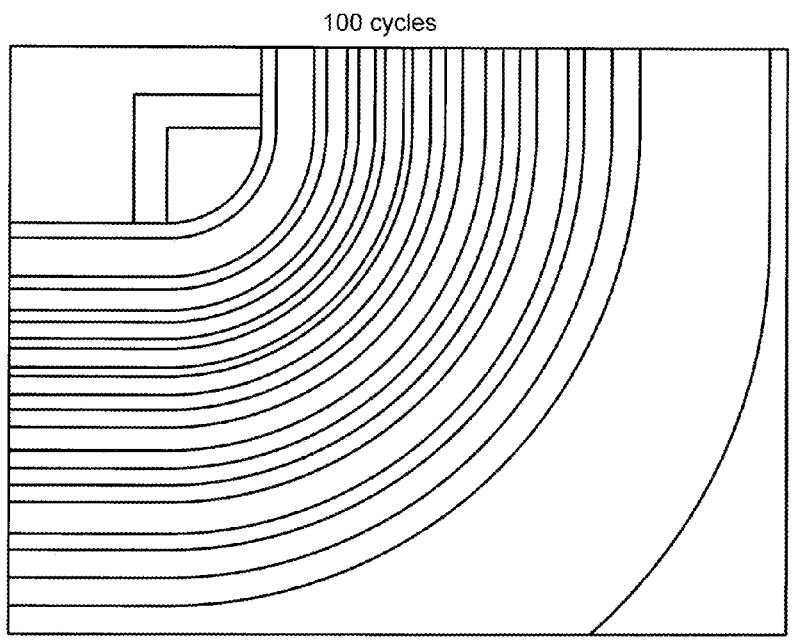
FIG. 22 is a conceptual diagram schematically showing a planar form of the front surface of an element end portion of a semiconductor chip after a temperature and humidity test.
Figure 23:
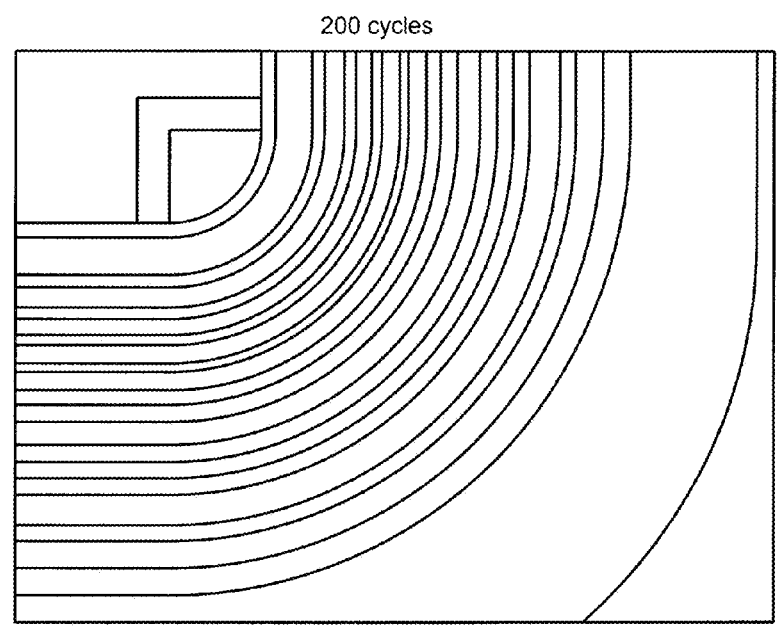
FIG. 23 is a conceptual diagram schematically showing a planar form of the front surface of an element end portion of a semiconductor chip after a temperature and humidity test.
Figure 24:
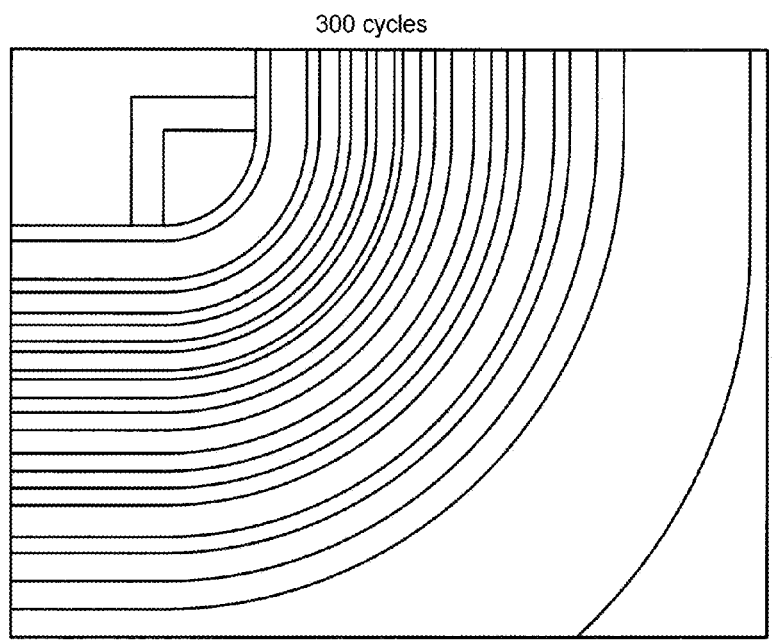
FIG. 24 is a conceptual diagram schematically showing a planar form of the front surface of an element end portion of a semiconductor chip after a temperature and humidity test.
Figure 25:
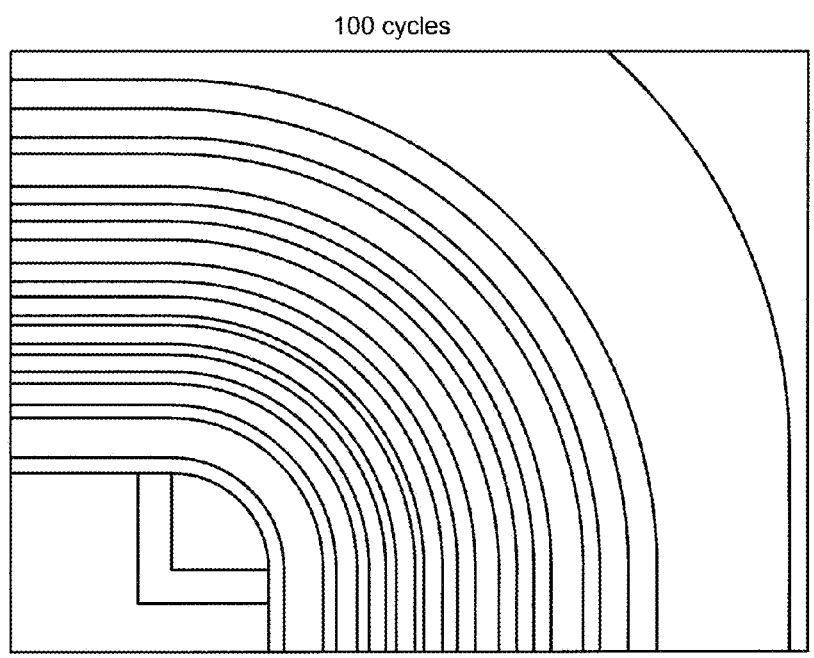
FIG. 25 is a conceptual diagram schematically showing a planar form of the front surface of an element end portion of a semiconductor chip after a temperature and humidity test.
Figure 26:
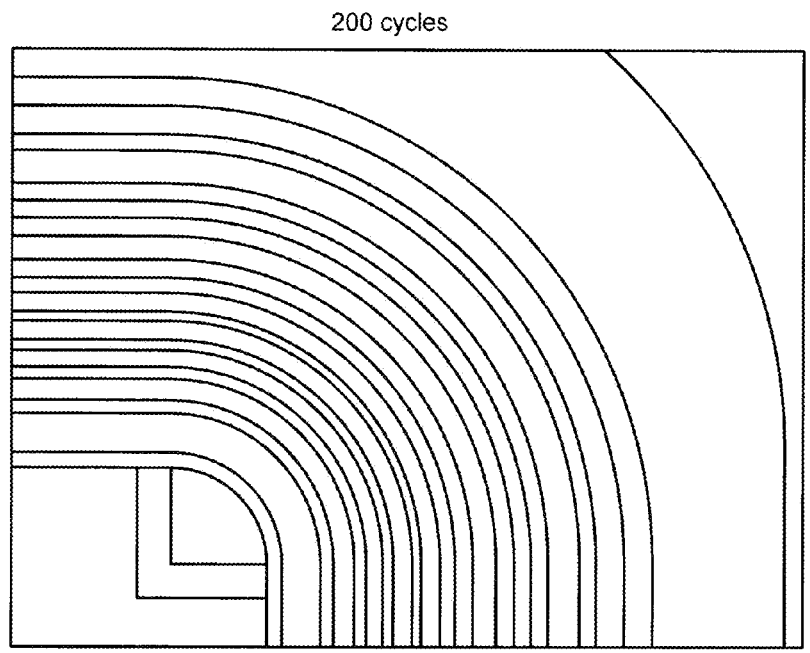
FIG. 26 is a conceptual diagram schematically showing a planar form of the front surface of an element end portion of a semiconductor chip after a temperature and humidity test.

The planar form of the front surface of the first working example after the H/S test is shown in FIGS. 22 to 24 (100, 200, and 300 cycles). Also, the planar form of the front surface of the second working example after the H/S test is shown in FIGS. 25 and 26 (100 and 200 cycles). Also, the planar form of the front surface of the comparison example after the H/S test is shown in FIGS. 27 to 30 (100 and 200 cycles). Also, the planar form of the front surface of the first heretofore known example after the H/S test is shown in FIGS. 31 to 33 (100 and 200 cycles).

With the first and second working examples, no cracking or detachment is confirmed in the passivation film or the like provided on the surface of the semiconductor chip even after carrying out 100 cycles of the H/S test (refer to FIGS. 22 and 25), then continuing until 200 cycles are carried out (refer to FIGS. 23 and 26). Also, with the first working example, the H/S test continues to be carried out further, but no cracking or detachment is confirmed in the passivation film or the like provided on the surface of the semiconductor chip even at the point at which 300 cycles are finished (refer to FIG. 24). Also, with the first and second working examples, no cracking is confirmed after the H/S test in the silicon (Si) portion or FP of, for example, a separation layer of the semiconductor chip (not shown).

Figure 27:
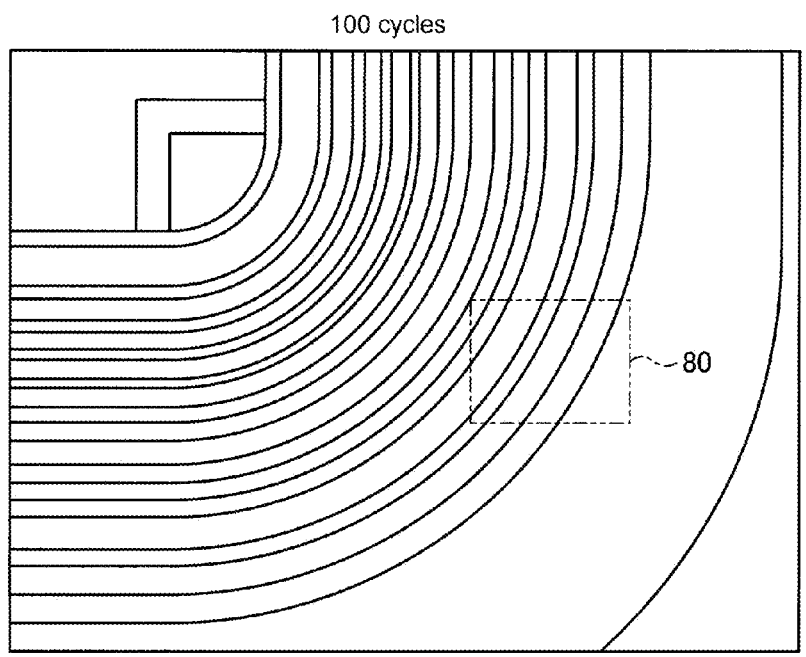
FIG. 27 is a conceptual diagram schematically showing a planar form of the front surface of an element end portion of a semiconductor chip after a temperature and humidity test.
Figure 28:
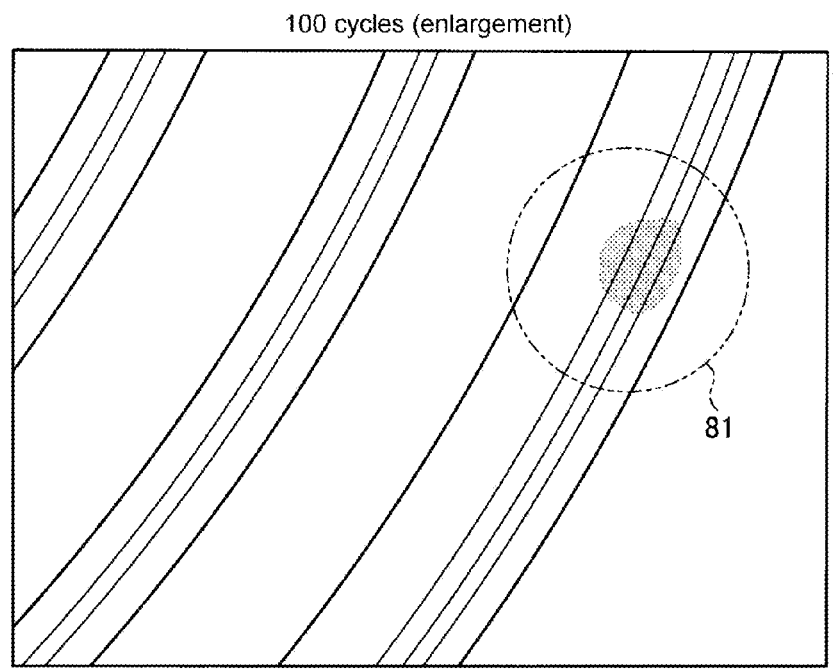
FIG. 28 is a conceptual diagram showing an enlargement of one portion of a planar form of an outermost peripheral portion of a passivation film shown in FIG. 27.
Figure 29:
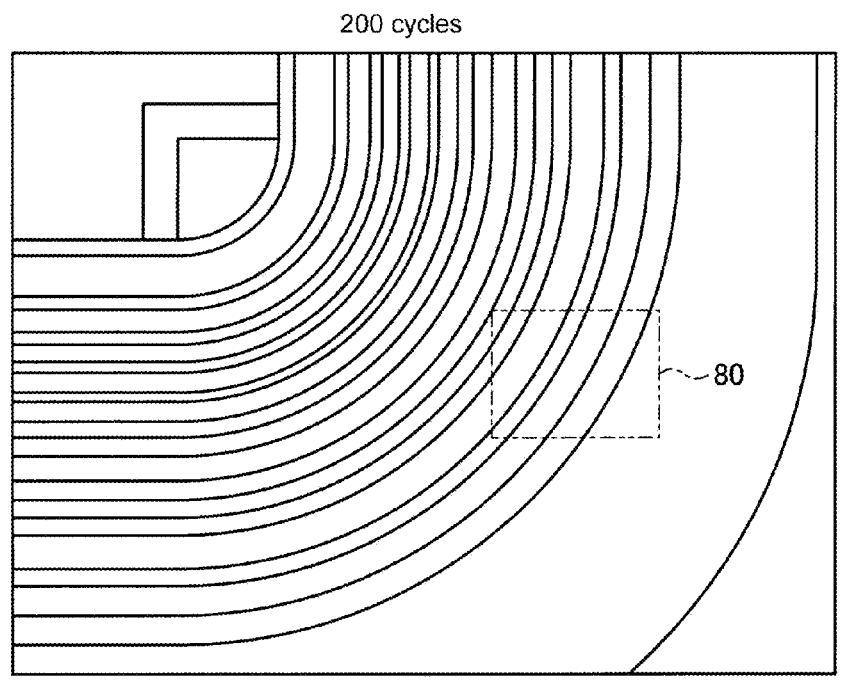
FIG. 29 is a conceptual diagram schematically showing a planar form of the front surface of an element end portion of a semiconductor chip after a temperature and humidity test.

Meanwhile, with the comparison example, crack 81 is confirmed in an outermost peripheral portion 80 of the passivation film after carrying out 100 cycles of the H/S test (refer to FIGS. 27 and 28). Also, continuing to carry out the H/S test, although no detachment of the passivation film is confirmed in the comparison example at the point at which 200 cycles are finished (refer to FIGS. 29 and 30), growth of an intermetallic compound formed from a constituent of an Au alloy is observed in an inner portion of the FP (not shown). A void occurs in the inner portion of the FP due to the growth of the intermetallic compound and, as the void changes shape owing to stress exerted on an eave portion of the semiconductor chip, it is supposed that cracking or detachment will occur in the FP and passivation film.

Also, with the first heretofore known example, it is confirmed that detachment 82 of the passivation film from the Si portion occurs (refer to FIG. 31). In FIG. 31, a condition in which the planar form of the passivation film is disturbed, and the passivation film is detached in places, is indicated by heavy shading. Also, with the first heretofore known example, continuing to carry out the H/S test, the range of the passivation film detachment widens, and it is confirmed that a portion 83 in which the FP is completely detached from the surface of the semiconductor chip occurs at the point at which 200 cycles are finished (refer to FIGS. 32 and 33). In FIG. 33, a condition in which the passivation film and FP are completely detached is indicated by heavy shading. Also, with the first heretofore known example, growth of an intermetallic compound formed from a constituent of an Au alloy is observed in an inner portion of the FP (not shown). The reason for this is the same as that with the comparison example.

Also, a semiconductor device having the same configuration as the first heretofore known example is fabricated (hereafter called a second heretofore known example). Then, a common air tank type of heat cycle (H/C) test is carried out on the second heretofore known example, the semiconductor device is exposed to an environment in which high temperature and low temperature are repeatedly alternated, and the durability of the semiconductor device is evaluated. The testing conditions of the H/C test are taken to be that the temperature is −40 to 125° C., one cycle is 180 minutes, and the testing cycle is 100 cycles. With the second heretofore known example too, growth of an intermetallic compound formed from a constituent of an Au alloy is observed in an inner portion of the FP (not shown).

From the heretofore described results, it is seen that when at least the bottom surface and bottom surface corner portion of the depressed portion of the semiconductor chip are covered with a polyimide resin film (the first and second working examples), no cracking or detachment occurs in the element end portion of the semiconductor chip even after 200 cycles of the H/S test are carried out. It is supposed that the reason for this is that, as no solder layer is formed on the bottom surface or bottom surface corner portion of the depressed portion owing to the polyimide resin film, the eave portion of the semiconductor chip is not joined to the insulating substrate by the solder layer, meaning that no bending stress is exerted on the eave portion of the semiconductor chip.

Meanwhile, with the first heretofore known example, as the element end portion of the semiconductor chip is thin in comparison with the active region side owing to the eave portion, and the eave portion is completely fixed to the insulating substrate by the solder layer, the element end portion is liable to bend due to stress from the exterior. For this reason, with the first and second heretofore known examples, it is supposed that deformation occurs locally in the element end portion of the semiconductor chip, and the passivation film becomes detached. As opposed to this, with the first and second working examples, as heretofore described, the eave portion is not fixed to the insulating substrate by the solder layer. For this reason, with the first and second working examples, it is supposed that no localized deformation occurs in the element end portion of the semiconductor chip, and no cracking or detachment occurs even after 200 cycles of the H/S test are carried out.

Because of this, it is seen that the resistance of the first and second working examples is high in comparison with that of the comparison example and first heretofore known example. Also, it is seen that with the semiconductor device according to the first and second embodiments too, as the bottom surface and bottom surface corner portion of the depressed portion are not joined to the insulating substrate by the solder layer, it is possible to obtain the same advantages as with the first and second working examples.

WORKING EXAMPLE 2

Figure 34:
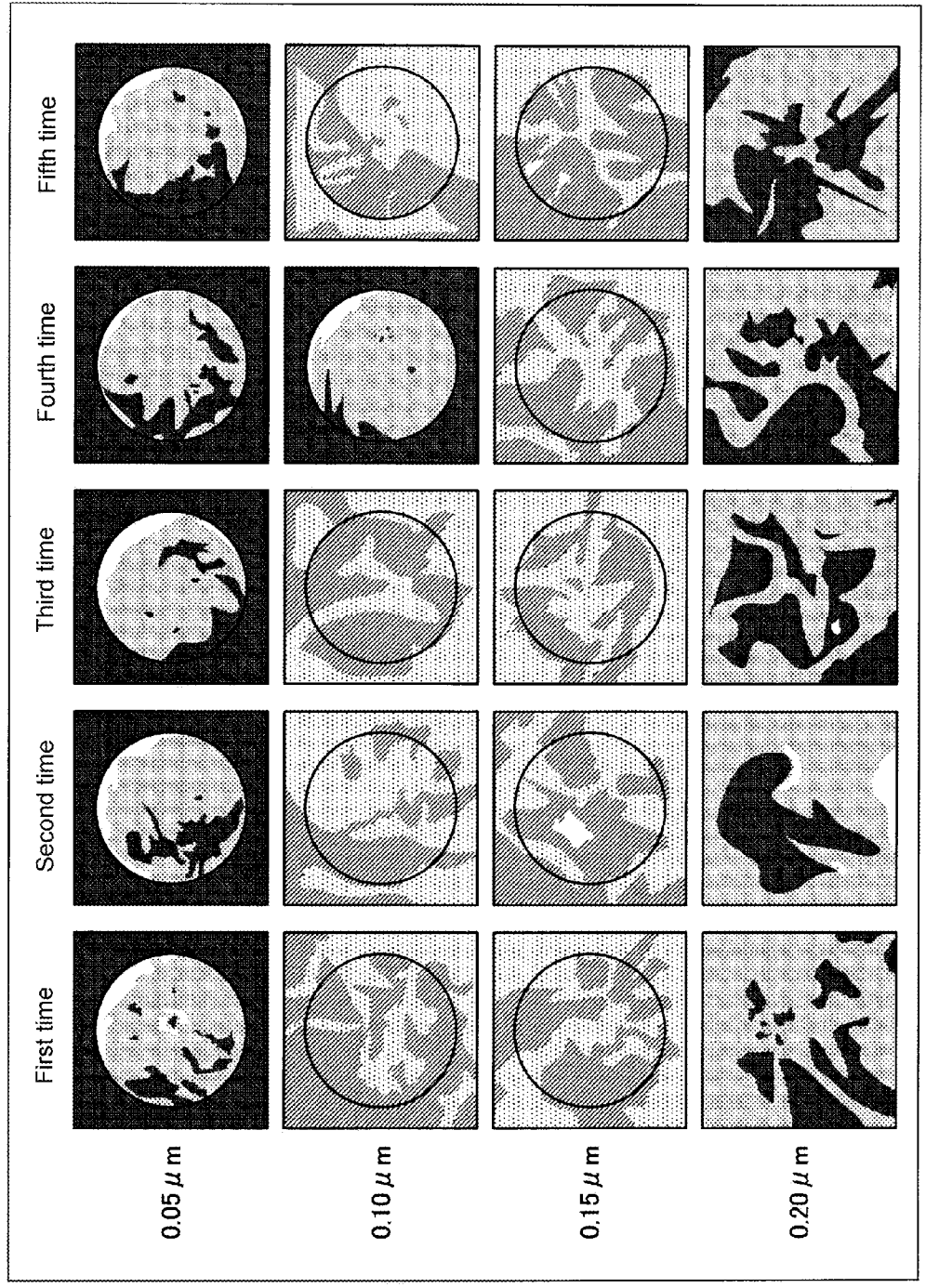
FIG. 34 is a characteristic diagram showing the relationship between the thickness of a metal electrode film and solder wettability.
Figure 35:
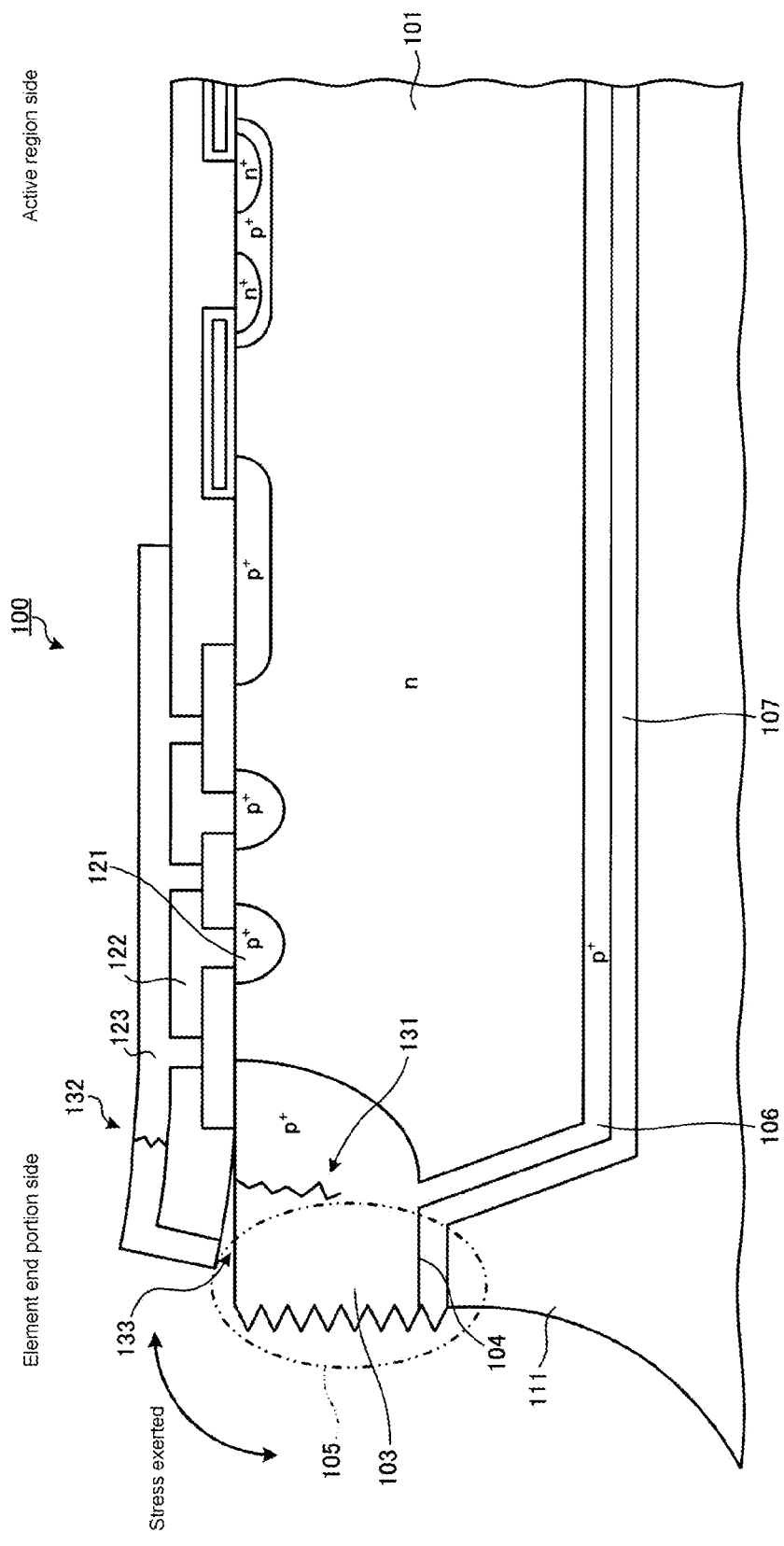
FIG. 35 is a sectional view showing in detail a main portion of a structure of a heretofore known semiconductor device.

FIG. 34 is a characteristic diagram showing the relationship between the thickness of a metal electrode film and solder wettability. FIG. 34 is a conceptual diagram schematically showing the planar form of solder applied to the surface of Au electrode films having differing thicknesses. In FIG. 34, the liquefied solder and the Au electrode film are shown by shading. In FIG. 34, the comparatively light portion is the liquefied solder, and the darkest portion is the Au electrode film. Firstly, first to fourth specimens wherein an Au electrode film is formed on the surface of an Si substrate are fabricated. With the first to fourth specimens, the thickness of the Au electrode film is 0.05 μm, 0.10 μm, 0.15 μm, and 0.20 μm respectively. Then, the same amount and same size of a paste form solder is applied to the surface of the first to fourth specimens and melted, and the solder wettability with respect to the thickness of the metal electrode film is verified. The verification is carried out five times for each specimen.

With the first specimen (film thickness 0.05 μm), it is confirmed that the solder on the Au electrode film does not flow away from the position of application in any of the verifications. That is, it is seen that the solder wettability on the first specimen is poor. Meanwhile, with the second specimen (film thickness 0.10 μm), it is seen that, except for in one verification, the solder on the Au electrode film flows away from the position of application. Also, with the third and fourth specimens (film thickness 0.15 μm or more), it is seen that the solder on the Au electrode film flows away from the position of application in all of the verifications. That is, it is seen that the solder wettability on the second to fourth specimens is good (refer to FIG. 34).

From the heretofore described results, it is seen that it is possible to worsen the solder wettability on the Au electrode film by forming the Au electrode film to a thickness of 0.05 μm or less. It is seen that it is possible to improve the solder wettability on the Au electrode film by forming the Au electrode film to a thickness of more than 0.05 μm.

For the invention, a description has been given of a semiconductor chip on which is formed a reverse blocking type of semiconductor element but, not being limited to the heretofore described embodiments, it is possible to apply the invention to a semiconductor chip including in the element end portion a portion (an eave portion) which is thinner than the active region side. Also, the side wall of the depressed portion provided in the semiconductor chip may be inclined with respect to the surface of the semiconductor chip, or may be formed approximately vertically. In this case, the depressed portion may be formed using, for example, a dry etching.

As heretofore described, the semiconductor device and semiconductor device manufacturing method according to the invention is useful in a power semiconductor device used in a power converting device and various kinds of industrial machinery, such as a bidirectional type device or reverse blocking type device having bidirectional voltage resistance characteristics.

Thus, a semiconductor device and semiconductor device manufacturing method have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2010-133365, filed on Jun. 10, 2010. The disclosure of the priority application in its entirety, including the drawings, claims, and the specification thereof, is incorporated herein by reference.

What is claimed is:
1. A semiconductor device, comprising:
a front surface element structure provided on a first main surface of a first conductivity type substrate;

a second conductivity type first semiconductor region provided in an element end portion of the first main surface of the substrate;

a depressed portion reaching the first semiconductor region from a second main surface of the substrate;

a second conductivity type second semiconductor region electrically connected to the first semiconductor region provided on the second main surface of the substrate; and an electrode formed from an electrode film of at least more than one layer provided over the whole surface of the second semiconductor region, wherein the thickness of the outermost electrode film of the electrode provided on a side wall of the depressed portion is 0.05 µm or less.

2. The semiconductor device according to claim 1, wherein the thickness of the outermost electrode film of the electrode provided on a bottom surface of the depressed portion is 0.05 µm or less.

3. The semiconductor device according to claim 1, further comprising a solder layer covering the electrode other than portions of the electrode which are provided on the side wall and bottom surface of the depressed portion.

4. The semiconductor device according to claim 3, wherein the solder layer further covers the electrode provided on an open end portion of the depressed portion.

5. A semiconductor device, comprising:
a front surface element structure provided on a first main surface of a first conductivity type substrate;

a second conductivity type first semiconductor region provided in an element end portion of the first main surface of the substrate;

a depressed portion reaching the first semiconductor region from a second main surface of the substrate;

a second conductivity type second semiconductor region electrically connected to the first semiconductor region provided on the second main surface of the substrate; and an electrode in contact with the second semiconductor region provided extending from an element central portion of the second main surface of the substrate to a side wall of the depressed portion.

6. A semiconductor device, comprising:
a front surface element structure provided on a first main surface of a first conductivity type substrate;

a second conductivity type first semiconductor region provided in an element end portion of the first main surface of the substrate;

a depressed portion reaching the first semiconductor region from a second main surface of the substrate;

a second conductivity type second semiconductor region electrically connected to the first semiconductor region provided on the second main surface of the substrate; and an electrode provided over the whole surface of the second semiconductor region, wherein the electrode provided on a side wall and bottom surface of the depressed portion is covered with a film formed from a material with poor solder wettability.

7. The semiconductor device according to claim 6, wherein the film formed from a material with poor solder wettability covers only the electrode provided on the bottom surface of the depressed portion.

8. The semiconductor device according to claim 6, wherein the film formed from a material with poor solder wettability is a polyimide resin film.

9. The semiconductor device according to claim 5, further comprising a solder layer covering the electrode exposed on the second main surface side of the substrate.

* * * * *